(12) United States Patent
Zhang et al.

(10) Patent No.: US 12,041,766 B2
(45) Date of Patent: Jul. 16, 2024

(54) MANUFACTURING METHOD OF SEMICONDUCTOR DEVICE

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 390 days.

(21) Appl. No.: 17/647,666

(22) Filed: Jan. 11, 2022

(65) Prior Publication Data

US 2022/0130838 A1 Apr. 28, 2022

Related U.S. Application Data

(63) Continuation of application No. PCT/CN2021/112303, filed on Aug. 12, 2021.

(30) Foreign Application Priority Data

Sep. 18, 2020 (CN) .......................... 202010988658.3

(51) Int. Cl.
*H10B 12/00* (2023.01)
(52) U.S. Cl.
CPC ................................. *H10B 12/482* (2023.02)
(58) Field of Classification Search
CPC ........... H01L 21/3086; H01L 21/31144; H10B 12/0335
See application file for complete search history.

(56) References Cited

U.S. PATENT DOCUMENTS 6,852,620 B2  2/2005  Kim
7,045,875 B2  5/2006  Kim
(Continued)

FOREIGN PATENT DOCUMENTS

CN   1474436 A    2/2004
CN   101308812 A   11/2008
(Continued)

OTHER PUBLICATIONS

International Search Report as cited in PCT Application No. PCT/CN2021/112303 mailed Nov. 17, 2021, 9 pages.
(Continued)

*Primary Examiner* — Samuel A Gebremariam
(74) *Attorney, Agent, or Firm* — Kilpatrick Townsend & Stockton LLP

(57) ABSTRACT

An embodiment of the present application provides a manufacturing method of a semiconductor structure, including: providing a base; forming a first mask layer with a first mask pattern on the base, and etching the base with the first mask layer as a mask to form an active region; forming a plurality of discrete bitlines on the active region; sequentially stacking a first spacer layer and a second spacer layer on a side wall of the bitline; forming a sacrificial layer between the adjacent second spacer layers; forming a second mask layer with a second mask pattern on the sacrificial layer, the first mask pattern being complementary to the second mask pattern; etching the sacrificial layer with the second mask layer and the bitline as masks to form multiple contact hole structures; and etching the first spacer layer to form a gap between the second spacer layer and the bitline.

19 Claims, 23 Drawing Sheets

(56) References Cited

U.S. PATENT DOCUMENTS

| | | |
|---|---|---|
| 7,799,643 B2 | 9/2010 | Kang |
| 7,846,825 B2 | 12/2010 | Kang |
| 8,129,244 B2 | 3/2012 | Eun |
| 8,163,646 B2 | 4/2012 | Kang |
| 8,723,289 B2 | 5/2014 | Kang |
| 9,634,012 B2 | 4/2017 | Park |
| 9,659,940 B2 | 5/2017 | Park |
| 10,566,333 B2 | 2/2020 | Lee |
| 10,748,908 B2 | 8/2020 | Lee |
| 2004/0016964 A1 | 1/2004 | Kim |
| 2005/0098850 A1 | 5/2005 | Kim |
| 2008/0283957 A1 | 11/2008 | Kang |
| 2010/0327407 A1 | 12/2010 | Kang |
| 2011/0129974 A1 | 6/2011 | Eun |
| 2012/0175692 A1 | 7/2012 | Kang |
| 2015/0014759 A1 | 1/2015 | Lee et al. |
| 2017/0005099 A1 | 1/2017 | Lee et al. |
| 2019/0279988 A1 | 9/2019 | Lee et al. |

FOREIGN PATENT DOCUMENTS

| | | |
|---|---|---|
| CN | 101937877 A | 1/2011 |
| CN | 102082095 A | 6/2011 |
| CN | 106941097 A | 7/2017 |
| CN | 109148376 A | 1/2019 |
| CN | 111640705 A | 9/2020 |

OTHER PUBLICATIONS

International Search Report in the international application No. PCT/CN2021/101617, mailed on Sep. 28, 2021, 5 pages.

Written Opinion cited in PCT/CN2021/101617, mailed on Sep. 28, 2021, 6 pages.

Written Opinion cited in PCT/CN2021/112303, mailed on Nov. 17, 2021, 7 pages.

MANUFACTURING METHOD OF SEMICONDUCTOR DEVICE

CROSS-REFERENCE TO RELATED APPLICATIONS

This application is a continuation of International Patent Application No. PCT/CN2021/112303, filed on Aug. 12, 2021, which is based on and claims priority to Chinese Patent Application No. 202010988658.3, filed on Sep. 18, 2020. The entire contents of International Patent Application No. PCT/CN2021/112303 and Chinese Patent Application No. 202010988658.3 are incorporated herein by reference.

TECHNICAL FIELD

An embodiment of the present application relates to the field of semiconductor technologies, in particular, to a manufacturing method of a semiconductor structure.

BACKGROUND

A photomask is a master mask which is made of a quartz material and may be used in a semiconductor exposure process. In addition to a cost of the raw material, such as quartz, or the like, a manufacturing cost of the photomask includes a use cost of a photomask writing machine, costs of software and a server for detecting related data of the photomask, and a manual development cost, and therefore is high.

Manufacturing steps of a semiconductor structure include a plurality of working procedures, mask layers in different working procedures often have different patterns, and therefore, different photomasks are required in manufacture of the mask layers; the more the required photomasks, the higher a manufacturing cost of the semiconductor structure.

In some embodiments, as a semiconductor process shrinks, adjacent conductive structures have a gradually shortened distance, such that a parasitic capacitance problem exists between adjacent bitlines, between a bitline and a contact structure, and between adjacent contact structures.

SUMMARY

An embodiment of the present application provides a manufacturing method of a semiconductor structure, including: providing a base; forming a first mask layer with a first mask pattern on the base, and etching the base with the first mask layer as a mask to form an active region; forming a plurality of discrete bitlines on the active region; sequentially stacking a first spacer layer and a second spacer layer on a side wall of the bitline; forming a sacrificial layer between the adjacent second spacer layers; forming a second mask layer with a second mask pattern on the sacrificial layer, the first mask pattern being complementary to the second mask pattern; etching the sacrificial layer with the second mask layer as a mask to form a plurality of contact hole structures; and etching the first spacer layer to form a gap between the second spacer layer and the bitline.

BRIEF DESCRIPTION OF DRAWINGS

The exemplary descriptions of one or more embodiments are made by using the corresponding drawings. These exemplary descriptions are not intended to limit the embodiments. The figures of the drawings are not shown to scale unless specifically stated.

DESCRIPTION OF EMBODIMENTS

From the background, a semiconductor structure in a prior art has a high manufacturing cost, and a large parasitic capacitance exists between adjacent bitlines and contact structures.

Specifically, in a process of manufacturing the semiconductor structure, a first mask layer required for forming an active region is different from a second mask layer required for forming the contact structure, and a first mask pattern of the first mask layer is not related to a second mask pattern of the second mask layer, such that different photomasks are required for manufacturing the first mask layer and the second mask layer. Since the photomask has a high manufacturing cost, the semiconductor structure manufactured depending on the photomask also has a high manufacturing cost. Furthermore, since a spacer layer of the bitline has a large dielectric constant, the large parasitic capacitance exists between the subsequently-formed contact structures and bitlines.

An embodiment of the present application provides a manufacturing method of a semiconductor structure, in which a base is etched with a first mask layer having a first mask pattern as a mask to form an active region, and a sacrificial layer is etched with a second mask layer having a second mask pattern and a cover layer of a bitline as a mask to form a contact structure. The first mask pattern is complementary to the second mask pattern, such that the first mask layer and the second mask layer may be manufactured using a same photomask, and therefore, a manufacturing cost of the semiconductor structure may be reduced by reducing a number of the manufactured photomasks. In some embodiments, in the process step of etching the sacrificial layer with the second mask layer to form a contact hole structure, a first spacer layer is further etched, such that a gap is formed between a second spacer layer and the bitline, and a dielectric constant between the subsequently-formed contact structures and bitlines is reduced by the formed gap, thereby reducing a parasitic capacitance between the contact structures and the bitlines, and improving electrical properties of the semiconductor structure.

The detailed description of the embodiments of the present application is given below in combination with the accompanying drawings. The ordinary skills in the art can understand that many technical details are provided in the embodiments of the present application so as to make the readers better understand the present application. However, even if these technical details are not provided and based on a variety of variations and modifications of the following embodiments, the technical solutions sought for protection in the present application can also be realized.

The manufacturing method of a semiconductor structure according to the present embodiment will be described in detail below with reference to the accompanying drawings.

Figure 1:
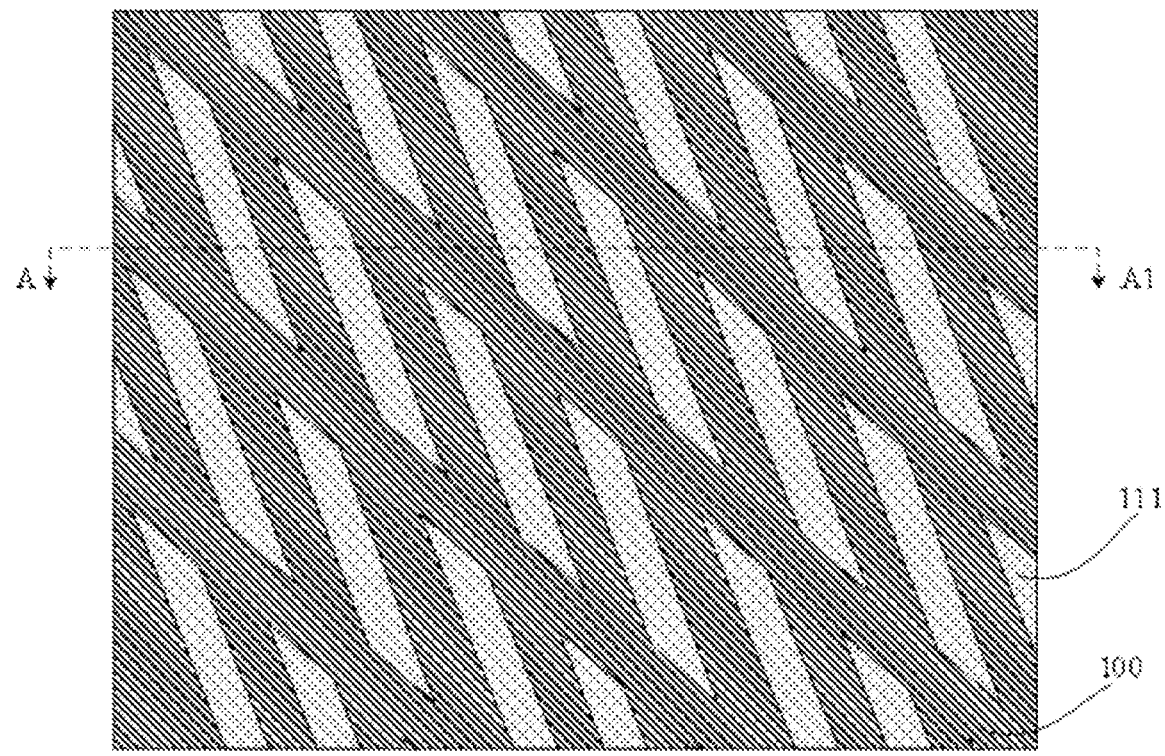
FIG. 1 is a schematic top structural diagram of a first mask layer according to an embodiment of the present application.
Figure 2:
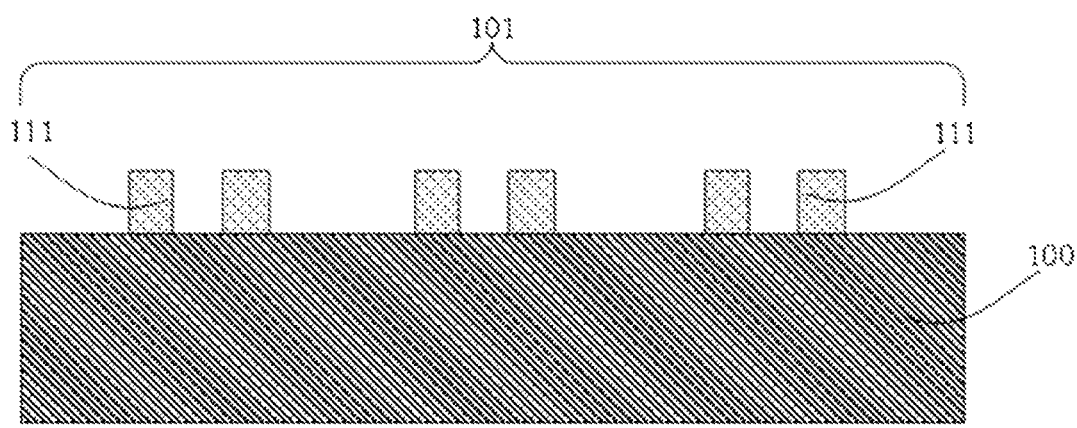
FIG. 2 is a schematic sectional structural diagram of the first mask layer according to the embodiment of the present application.
Figure 3:
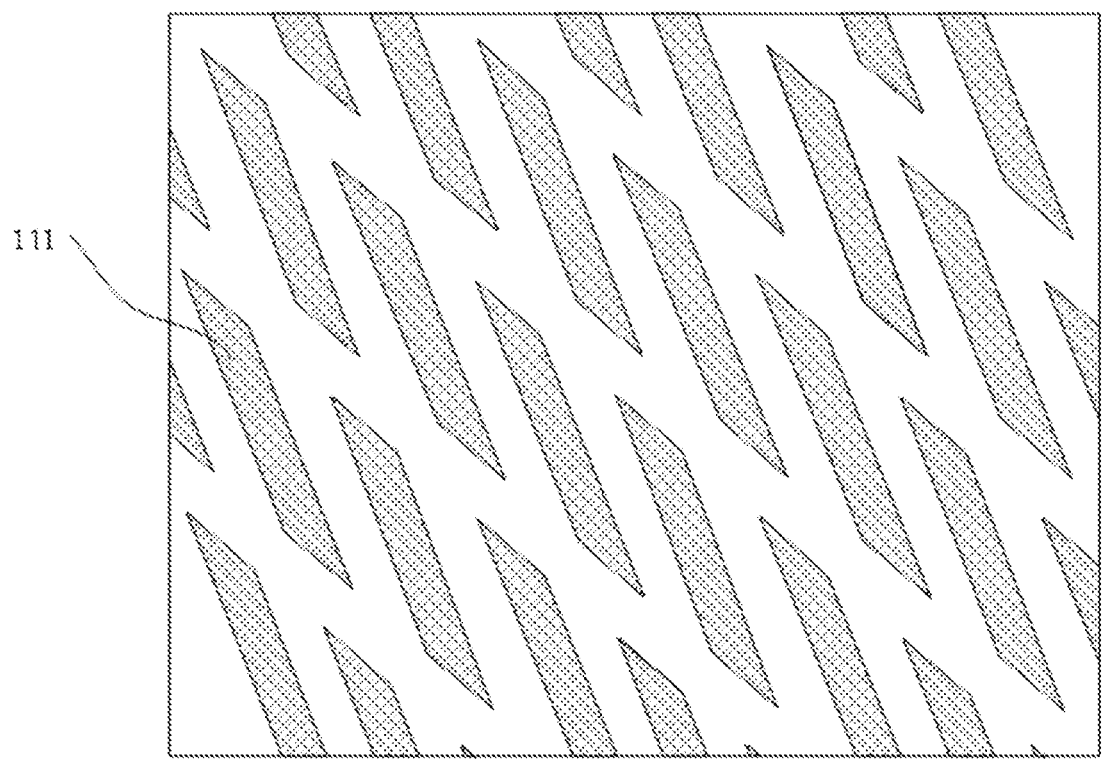
FIG. 3 is a schematic top structural diagram of a first mask pattern according to the embodiment of the present application.

Referring to FIGS. 1 to 3, FIG. 1 is a schematic top structural diagram of the first mask layer, FIG. 2 is a schematic sectional structural diagram taken along direction AA1 in FIG. 1, and FIG. 3 is a schematic top structural diagram of the first mask pattern. The base 100 is provided, and the first mask layer 101 with the first mask pattern 111 is formed on the base 100.

In the present embodiment, the base 100 is configured as a silicon substrate. In other embodiments, the base may also be configured as a semiconductor substrate, such as a germanium substrate, a silicon germanide substrate, a silicon carbide substrate, or a silicon-on-insulator substrate.

The first mask pattern 111 is configured to define a pattern and a position of the subsequently-formed active region. For example, in the present embodiment, the first mask pattern 111 includes an elongated pattern, and the first mask layer 101 has a plurality of elongated patterns arranged in an array. In the subsequent process step of forming the active region, the base 100 under the elongated pattern is not etched, and the base 100 under a region between adjacent elongated patterns is etched, thereby forming the plurality of active regions.

In the present embodiment, the first mask layer 101 has a single-layer structure, and may be made of a hard mask material, such as silicon oxide, silicon nitride, titanium nitride, or the like. In other embodiments, the first mask layer may also have a stacked structure.

In the present embodiment, the first mask pattern is formed using a first photomask and a second photomask. Steps of forming the first mask pattern will be described in detail below with reference to the accompanying drawings.

FIGS. 4 to 11 are schematic structural diagrams corresponding to the steps of forming the first mask pattern using the first photomask and the second photomask according to the present embodiment.

Figure 4:
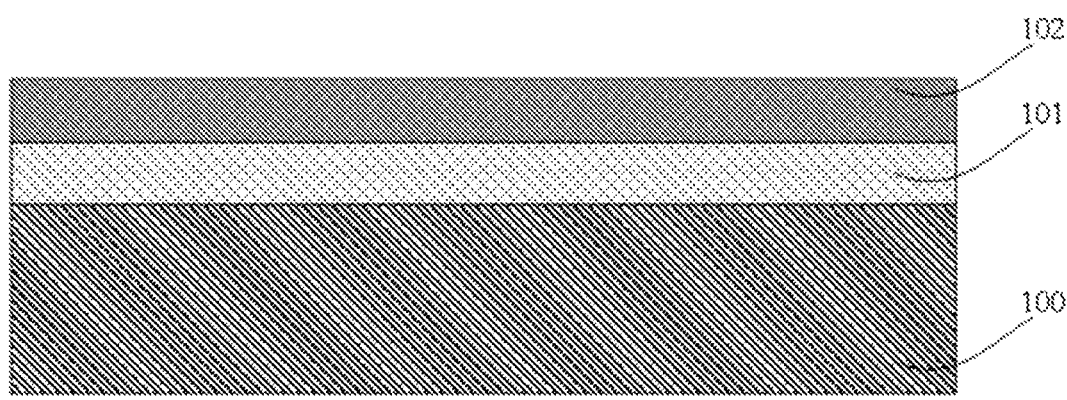
FIGS. 4 to 11 are schematic top structural diagrams corresponding to steps of forming the first mask pattern using a first photomask and a second photomask according to the embodiment of the present application.

Referring to FIG. 4, an unpatterned first mask layer 101 is formed on the base 100.

For example, the first mask layer 101 is located on the base 100 to provide a technological foundation for subsequent formation of a patterned first mask layer. In the present embodiment, the first mask layer 101 has a single-layer structure.

In order to improve accuracy of pattern transfer, in the present embodiment, a fourth mask layer 102 may be further formed on the unpatterned first mask layer 101, and the fourth mask layer 102 has a different material from the first mask layer 101.

In the subsequent pattern transfer process, a high etching selectivity exists between a subsequently-formed first photoresist line and the fourth mask layer 102, a high etching selectivity exists between the fourth mask layer 102 and the first mask layer 101, and a high etching selectivity exists between the first mask layer 101 and the base 100, thereby improving pattern precision of transferring a pattern in the subsequently-formed first photoresist line to the active region formed in the base 100.

Figure 5:
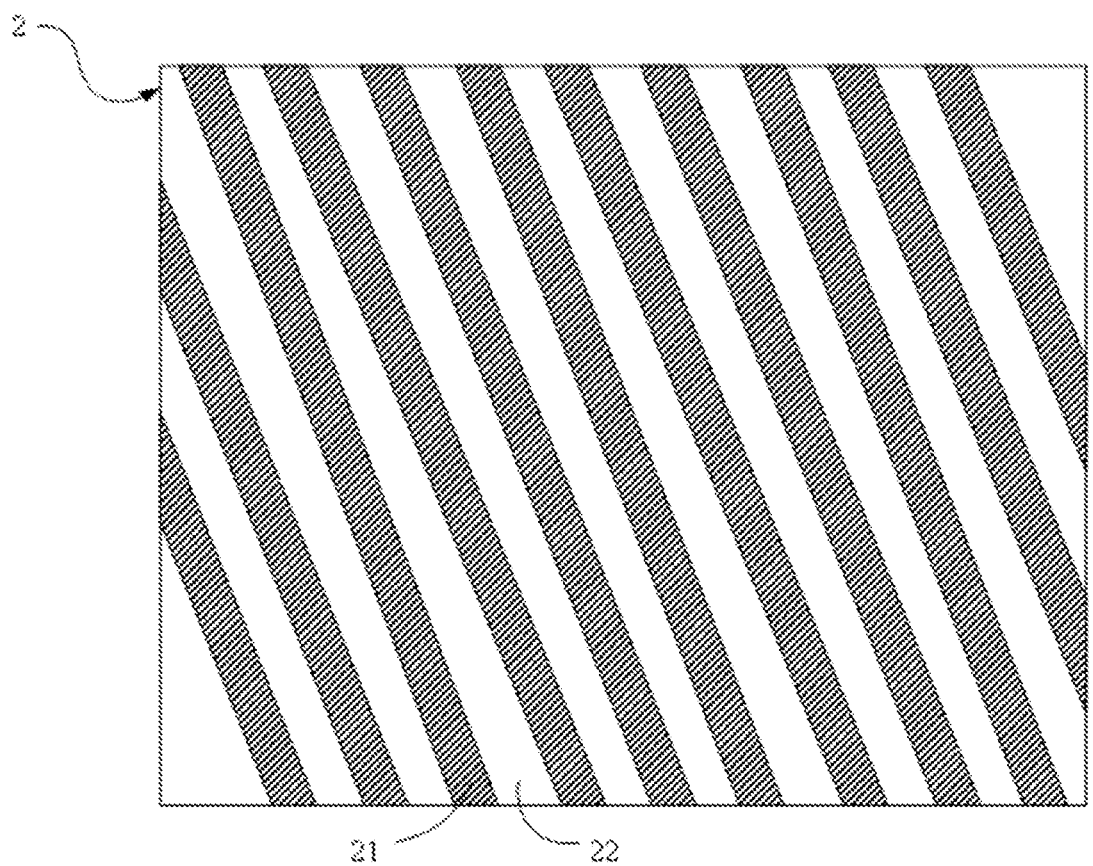
Figure 6:
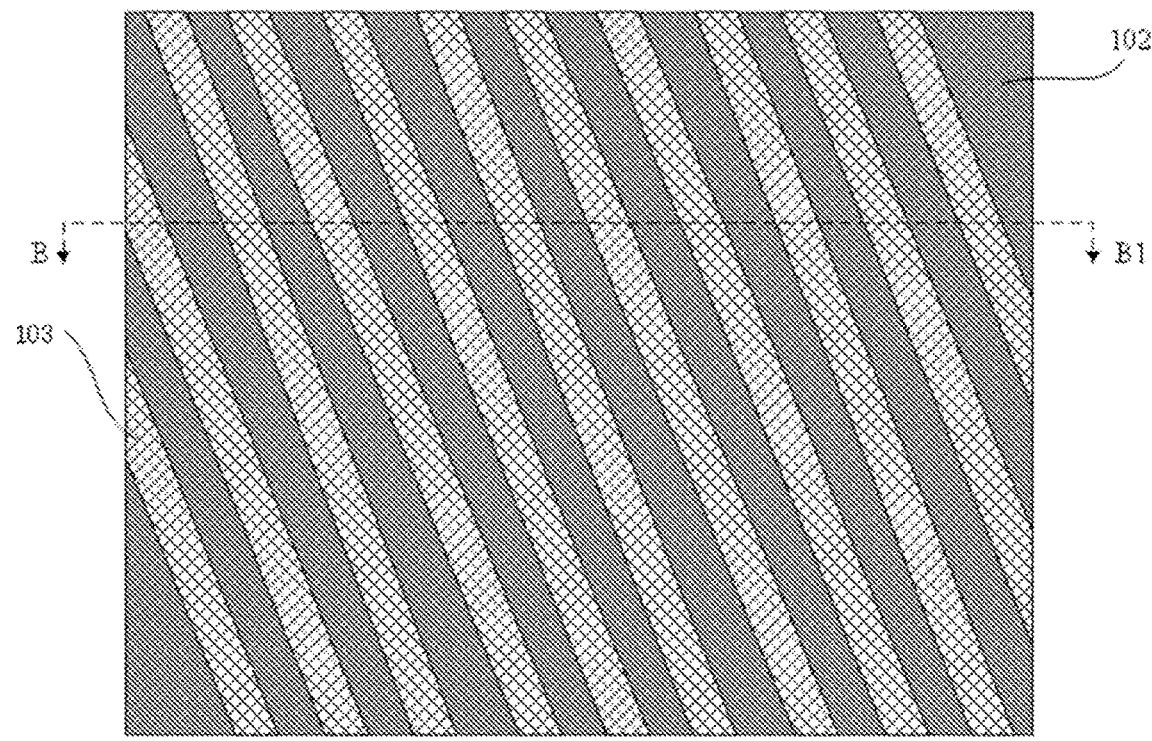

Referring to FIGS. 5 and 6, FIG. 5 is a schematic top structural diagram of the first photomask, and FIG. 6 is a schematic top structural diagram of the fourth mask layer with the first photoresist line; the first photomask 2 is provided; and the first photoresist line 103 extending in a first direction is formed on the first mask layer 101 using the first photomask 2.

The first photomask 2 has a first light-shielding region 21 and a first light-transmitting region 22. Positions of the first light-shielding region 21 and the first light-transmitting region 22 are related to properties of photoresist of the first photoresist line 103. For example, if the first photoresist line 103 is made of positive photoresist, the position of the first light-shielding region 21 corresponds to a position of the first photoresist line 103, and the first light-transmitting region 22 is configured to define a position of an adjacent first photoresist line; in other embodiments, if the first photoresist line is made of negative photoresist, the position of the first light-transmitting region corresponds to the position of the first photoresist line, and the first light-transmitting region is configured to define the position of the adjacent first photoresist line.

In the present embodiment, for example, the first photoresist line 103 is made of the positive photoresist, and the process step of forming the first photoresist line 103 includes: forming a photoresist film on the first mask layer 101; exposing the photoresist film using the first photomask 2, the photoresist film having an exposure region and a non-exposure region, the exposure region being opposite to the first light-transmitting region 22, the non-exposure region being opposite to the first light-shielding region 21, and properties of a material in the exposure region of the photoresist film being changed in the exposure process; after the exposure, performing development to remove the photoresist film in the exposure region, thereby forming the first photoresist line 103.

It may be understood that the first photoresist line may be made of negative photoresist in other embodiments.

Figure 7:
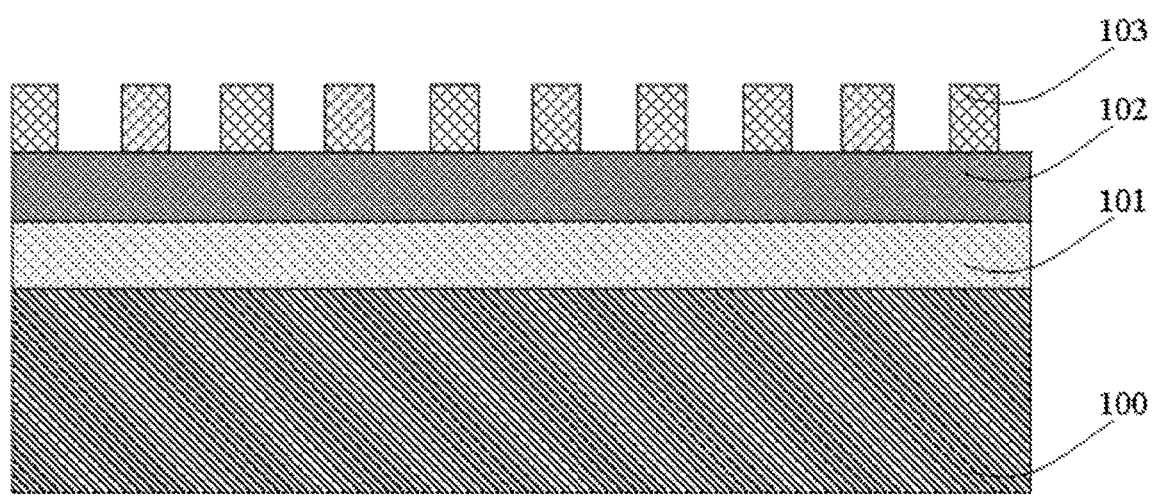
Figure 8:
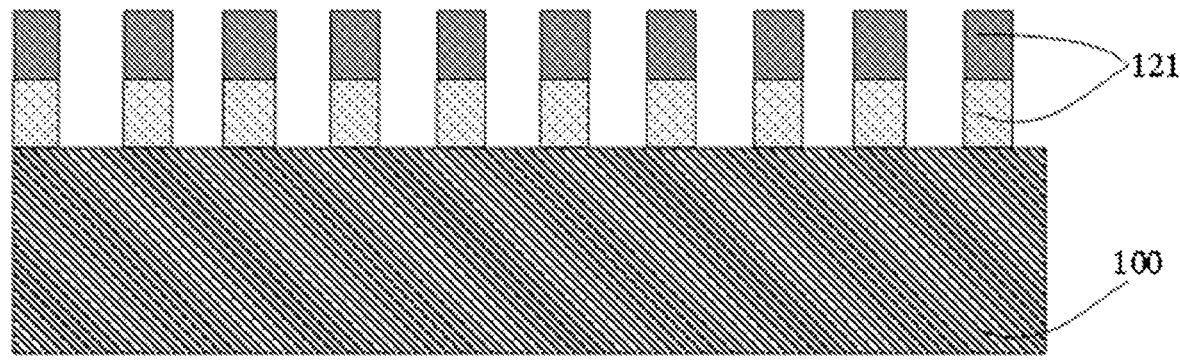

Referring to FIGS. 7 and 8, FIG. 7 is a schematic sectional structural diagram taken along direction BB1 in FIG. 6, and FIG. 8 is a schematic sectional structural diagram of the base with a first mask line; the first mask layer 101 is etched using the first photoresist line 103 to form the first mask line 121.

In the present embodiment, since the fourth mask layer 102 is further formed between the first photoresist line 103 and the first mask layer 101, the fourth mask layer 102 is first etched using the first photoresist line 103 to transfer the pattern in the first photoresist line 103 to the fourth mask layer 102, and then, the first mask layer 101 is etched using the fourth mask layer 102, so as to form the first mask line 121.

Since the high etching selectivity exists between the first photoresist line 103 and the fourth mask layer 102 and between the fourth mask layer 102 and the first mask layer 101, the formed first mask line 121 has high pattern precision, thereby facilitating an improvement of a pattern consistency between the first mask line 121 and the first photoresist line 103.

In the present embodiment, both the fourth mask layer 102 and the first mask layer 101 are etched using a dry etching method to form the first mask line 121.

Figure 9:
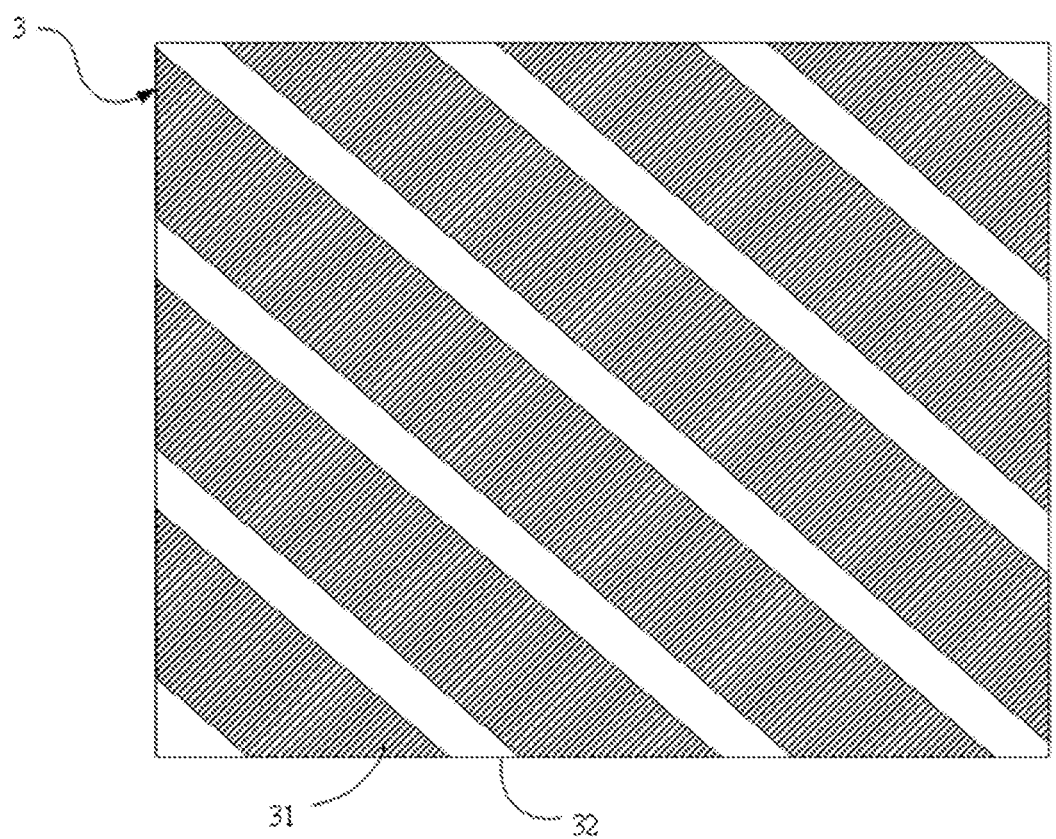
Figure 10:
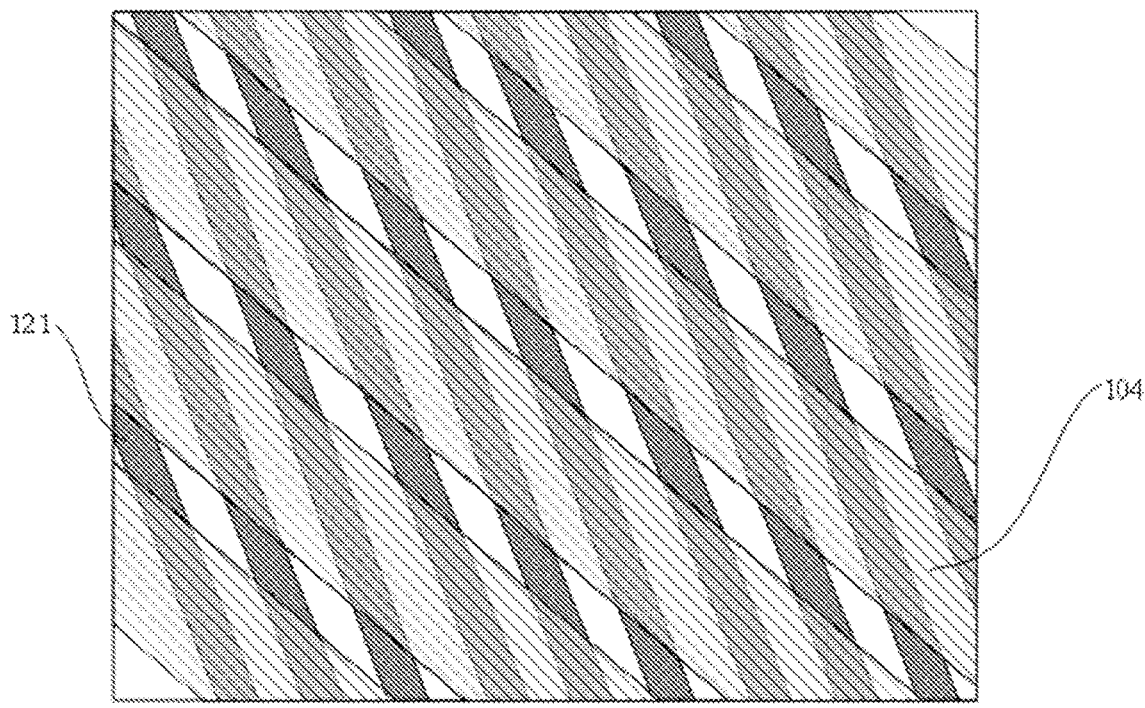

Referring to FIGS. 9 and 10, FIG. 9 is a schematic top structural diagram of the second photomask, and FIG. 10 is a schematic top structural diagram of the first mask line with a second photoresist line; the second photomask 3 is provided; and the second photoresist line 104 extending in a second direction is formed on the first mask line 121 using the second photomask 3.

The second photomask 3 has a second light-shielding region 31 and a second light-transmitting region 32. Positions of the second light-shielding region 31 and the second light-transmitting region 32 are related to properties of photoresist of the second photoresist line 104. For example, if the second photoresist line 104 is made of positive photoresist, the position of the second light-shielding region 31 corresponds to a position of the second photoresist line 104, and the second light-transmitting region 32 is configured to define a position of an adjacent second photoresist line 104; in other embodiments, if the second photoresist line is made of negative photoresist, the position of the second light-transmitting region corresponds to the position of the second photoresist line, and the second light-shielding region is configured to define the position of the adjacent second photoresist line.

In the present embodiment, for example, the second photoresist line 104 is made of the positive photoresist, and the process step of forming the second photoresist line 104 includes: forming a photoresist film on the first mask line 121 and in intervals between the adjacent first mask lines 121; exposing the photoresist film using the second photomask 3, the photoresist film having an exposure region and a non-exposure region, the exposure region being opposite to the second light-transmitting region 32, the non-exposure region being opposite to the second light-shielding region 31, and properties of a material in the exposure region of the photoresist film being changed in the exposure process; after the exposure, performing development to remove the photoresist film in the exposure region, thereby forming the second photoresist line 104.

It may be understood that the second photoresist line may be made of negative photoresist in other embodiments.

Referring to FIGS. 10 and 3, the first mask line 121 is etched using the second photoresist line 104 to form the elongated pattern.

In the present embodiment, the process step of forming the elongated pattern includes: etching the fourth mask layer 102 in intervals between the adjacent second photoresist lines 104 using the second photoresist lines 104 (referring to FIG. 8); then etching the first mask layer 101 with the remaining fourth mask layer 102 as a mask (referring to FIG. 8); and removing the second photoresist line 104 and the remaining fourth mask layer 102 to form the elongated pattern.

Figure 11:
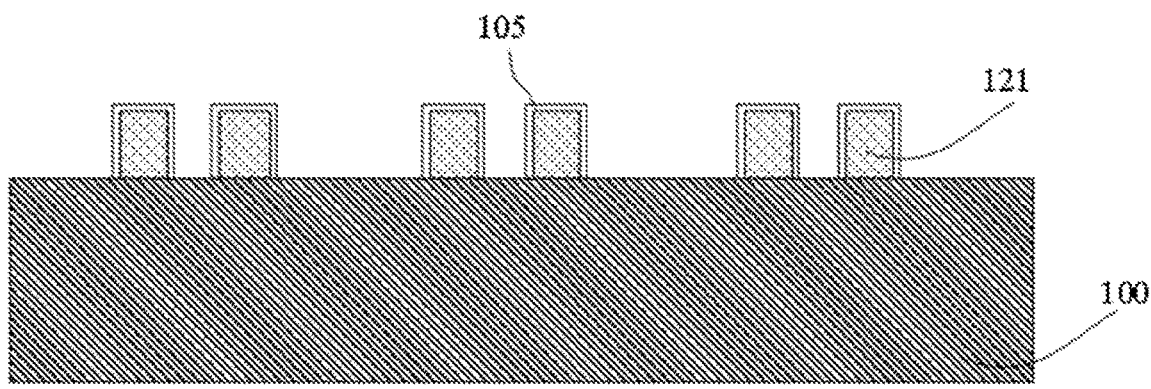

Referring to FIG. 11, FIG. 11 is a schematic sectional structural diagram in which a side wall of the elongated pattern is provided with a repair layer, and the repair layer 105 is formed on the side wall of the elongated pattern.

In the present embodiment, the process step of forming the repair layer 105 includes: forming an initial repair layer at tops and in intervals of the elongated patterns, the intervals of the elongated patterns being filled up with the initial repair layer; and removing part of the initial repair layer, and reserving the initial repair layer at the side wall and the top of the elongated pattern to form the repair layer 105, such that the active region has a smoother edge when the base 100 is subsequently etched with the first mask layer 101 (referring to FIG. 2) having the first mask pattern 111 (referring to FIG. 2) as the mask to form the active region. In other embodiments, only the initial repair layer at the side wall of the elongated pattern may be reserved to form the repair layer.

Figure 12:
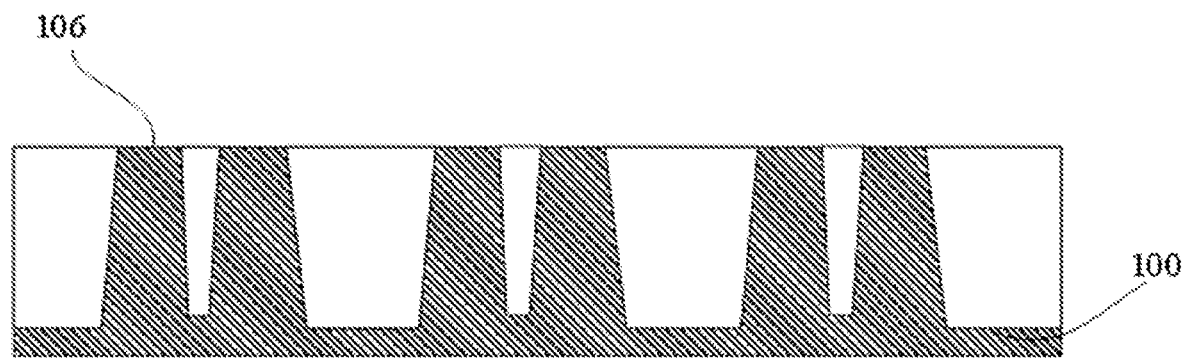
FIG. 12 is a schematic sectional structural diagram in which a base is etched to form an active region according to the embodiment of the present application.

In the present embodiment, a high etching selectivity exists between the repair layer 105 and the base 100, such that the first mask pattern 111 with the repair layer 105 may be accurately transferred onto the base 100; a material of the repair layer 105 includes silicon oxide, and the repair layer 105 has a thickness of 0.1 nm to 5 nm. Referring to FIGS. 11 and 12, the base 100 is etched with the first mask layer 101 (referring to FIG. 2) having the first mask pattern 111 (referring to FIG. 2) as the mask to form the active region 106.

In the present embodiment, in the step of forming the active region 106, since the adjacent elongated patterns are staggered, distances between the adjacent elongated patterns are not equal. When the adjacent elongated patterns have a small interval, the patterns are distributed densely, and an etched opening in this region has a small width; when the adjacent elongated patterns have a large interval, the patterns are distributed sparsely, the etched opening in this region has a large width, and with an increase of an etching depth, an effective reaction ingredient in the region with the etched opening having a small width has a reduced updating rate, resulting in reduction of an etching rate.

For example, when a volatile ingredient generated by the etching process is discharged from a deep trench and sufficient effective reaction ingredients are allowed to enter the deep trench to replenish the consumed portion, the etching process proceeds smoothly. However, with the increase of the etching depth, when the etched opening has a small width, the volatile ingredient has a decreased discharge speed, the effective reaction ingredient has a reduced updating rate, and therefore, the etching rate is reduced, such that the region with densely distributed patterns has a smaller etching depth than the region with sparsely distributed patterns in a same etching time.

In the present embodiment, the base 100 is etched using a dry etching method, and after the base 100 is etched, the first mask layer 101 (referring to FIG. 2) is removed to form the active region 106.

Figure 13:
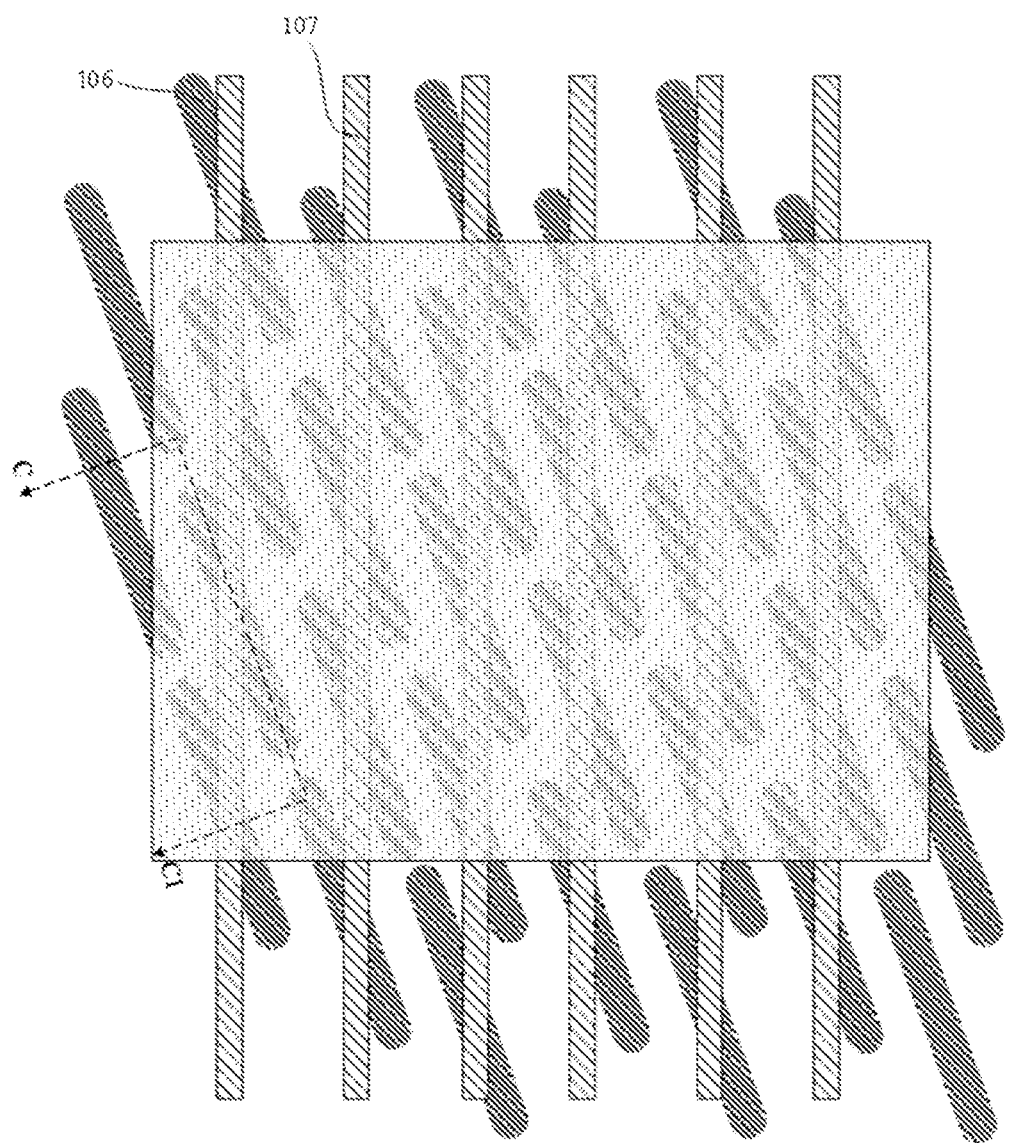
FIG. 13 is a schematic top structural diagram in which a bitline and a sacrificial layer are formed on the active region according to the embodiment of the present application.
Figure 14:
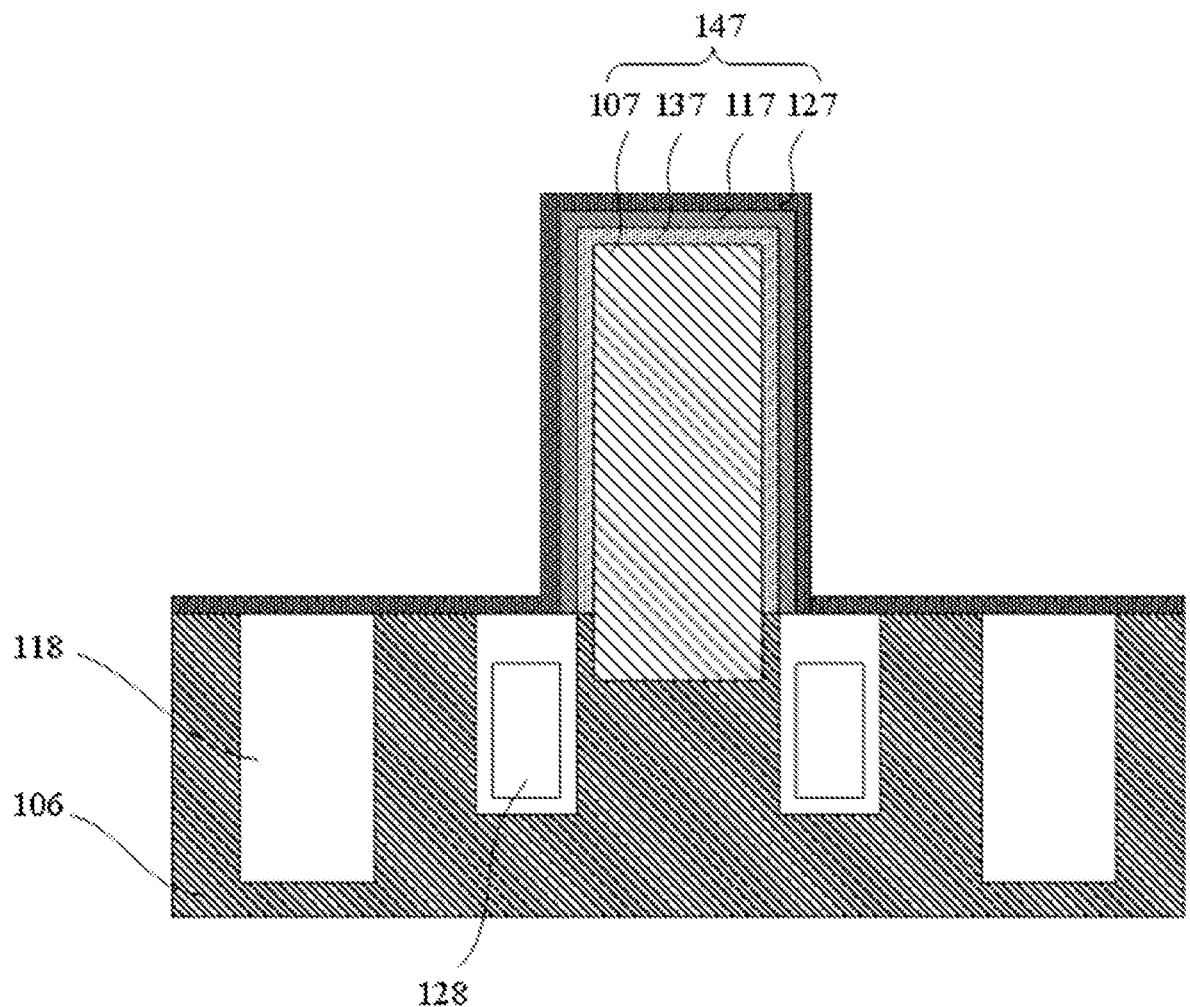
FIG. 14 is a schematic partial sectional structural diagram in which the bitline is formed on the active region.
Figure 15:
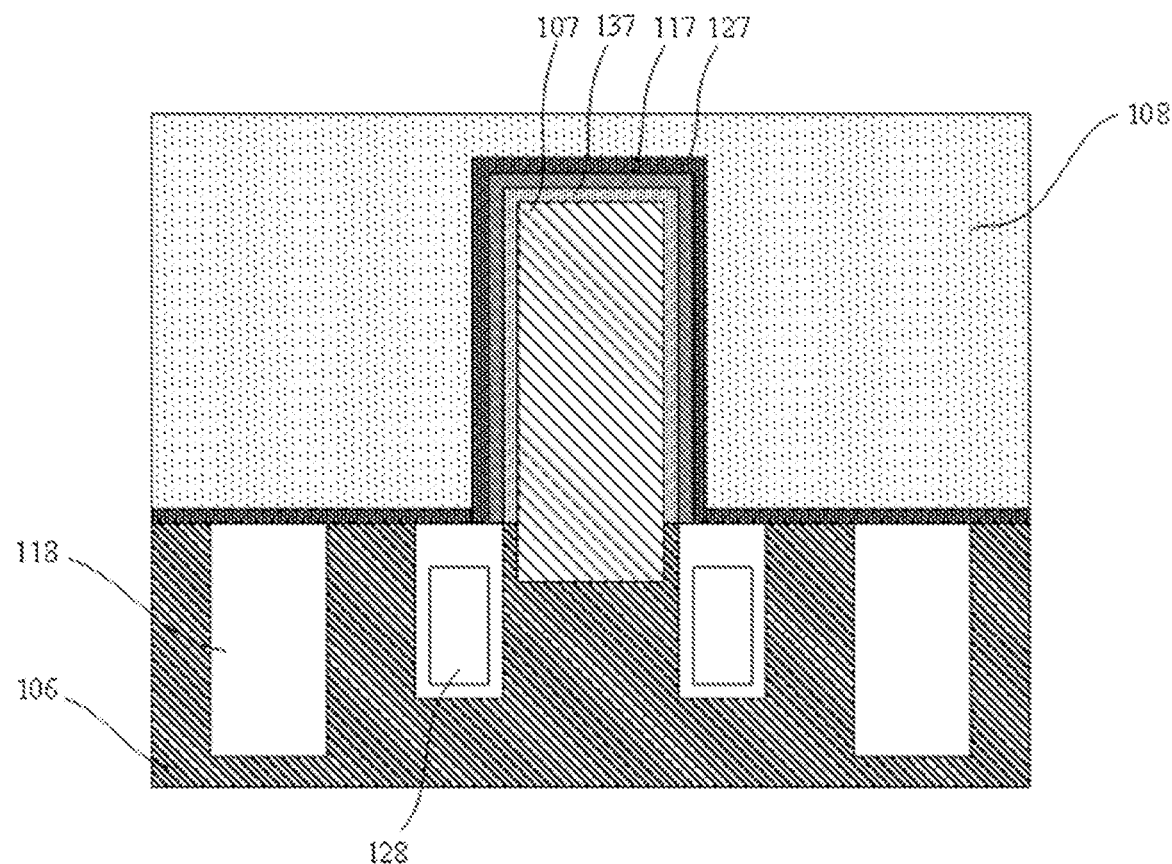
FIG. 15 is a schematic partial sectional structural diagram of FIG. 13 taken along direction CC1 according to the embodiment of the present application.
Figure 16:
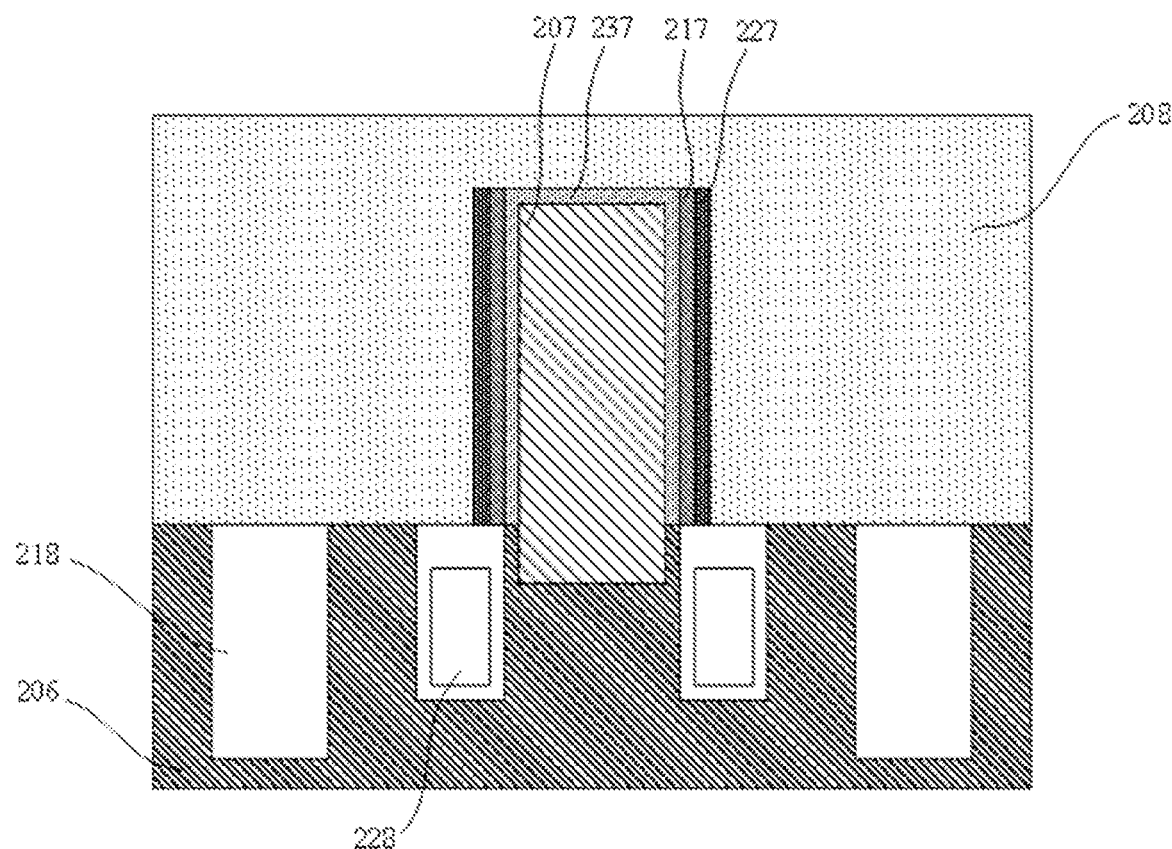
FIG. 16 is a schematic partial sectional structural diagram of FIG. 13 taken along direction CC1 according to another embodiment of the present application.

Referring to FIGS. 13 to 16, FIG. 13 is a schematic top structural diagram in which the bitline and the sacrificial layer are formed on the active region, FIG. 14 is a schematic partial sectional structural diagram in which the bitline is formed on the active region, FIG. 15 is a schematic partial sectional structural diagram of FIG. 13 taken along direction CC1 according to the present embodiment, and FIG. 16 is a schematic partial sectional structural diagram of FIG. 13 taken along direction CC1 according to another embodiment.

In the present embodiment, the plurality of discrete bitlines 107 are formed on the active region 106, and a first spacer layer 117 and a second spacer layer 127 are sequentially stacked on a side wall of the bitline 107. An isolation structure 118 and a wordline 128 are further formed in the active region 106 before formation of the bitline 107.

In the present embodiment, referring to FIG. 14, before formation of the sacrificial layer, the second spacer layer 127 is also formed at a top of the bitline 107, and before the first spacer layer 117 is etched subsequently, the second spacer layer 127 above the top of the bitline 107 is etched away to expose the first spacer layer 117.

In some embodiments, a third spacer layer 137 is further formed between the side wall of the bitline 107 and the first spacer layer 117, and made of a different material from the first spacer layer 117, and the first spacer layer 117 is made of a different material from the second spacer layer 127. A bitline structure 147 includes the bitline 107, the first spacer layer 117, the second spacer layer 127, and the third spacer layer 137.

The material of the first spacer layer 117 includes silicon oxide, the material of the second spacer layer 127 includes silicon nitride, and the material of the third spacer layer 137 includes silicon nitride.

A removal time of the first spacer layer 117 has various options. The options are specifically as follows.

In the present embodiment, referring to FIG. 15, the first spacer layer 117 and the third spacer layer 137 are also formed at the top of the bitline 107, and after the sacrificial layer 108 is formed, the second spacer layer 127 and the sacrificial layer 108 at the top of the bitline 107 are removed to expose the first spacer layer 117.

For example, in the process of etching the sacrificial layer 108 with the second mask layer as a mask after formation of the sacrificial layer 108, when the sacrificial layer 108 is etched until the second spacer layer 127 is exposed, etching gas or liquid is changed to etch the second spacer layer 127 at the top of the bitline 107, so as to expose the first spacer layer 117 covered by the second spacer layer 127; after the first spacer layer 117 is exposed, the etching gas or liquid is changed again to etch the remaining sacrificial layer 108 and the first spacer layer 117 at a time, so as to form the contact hole structure and the gap.

In some embodiments, the second spacer layer 127 is also located on a surface of the active region 106, and after removal of the sacrificial layer 108 and the first spacer layer 117, the etching gas or liquid is required to be replaced again to remove the second spacer layer 127 located on the surface of the active region 106, such that the subsequently-formed contact structure may directly contact the active region 106.

In the present embodiment, a material of the sacrificial layer 108 includes silicon dioxide, and the sacrificial layer 108 is also located above the bitline 107. In other embodiments, a top of the sacrificial layer may also be flush with the top of the bitline.

In other embodiments, referring to FIG. 16, the first spacer layer 217 and the third spacer layer 237 are also formed at the top of the bitline 207, and before the formation of the sacrificial layer 208, the second spacer layer 227 at the top of the bitline 207 is removed to expose the first spacer layer 217, the sacrificial layer 208 being made of a same material as the first spacer layer 217. Therefore, in the subsequent process of etching a structure under an elongated opening in the second mask layer 109 using the elongated opening, since the sacrificial layer 208 is made of the same material as the first spacer layer 217, and the first spacer layer is made of a different material from the second spacer layer and the third spacer layer, the corresponding sacrificial layer 208 and the corresponding first spacer layer 217 under the elongated opening may be etched away by the etching liquid at a time, and the second spacer layer 227 and the third spacer layer 237 are reserved to form the contact hole structure and the gap, such that one elongated opening may correspondingly form two contact hole structures and two gaps on two sides of the same bitline 207.

In some embodiments, the second spacer layer 227 is also located on the surface of the active region 206, and before formation of the sacrificial layer 208, the second spacer layer 227 located on the surface of the active region 206 is also removed, such that the subsequently-formed contact structure may directly contact the active region 206.

Figure 17:
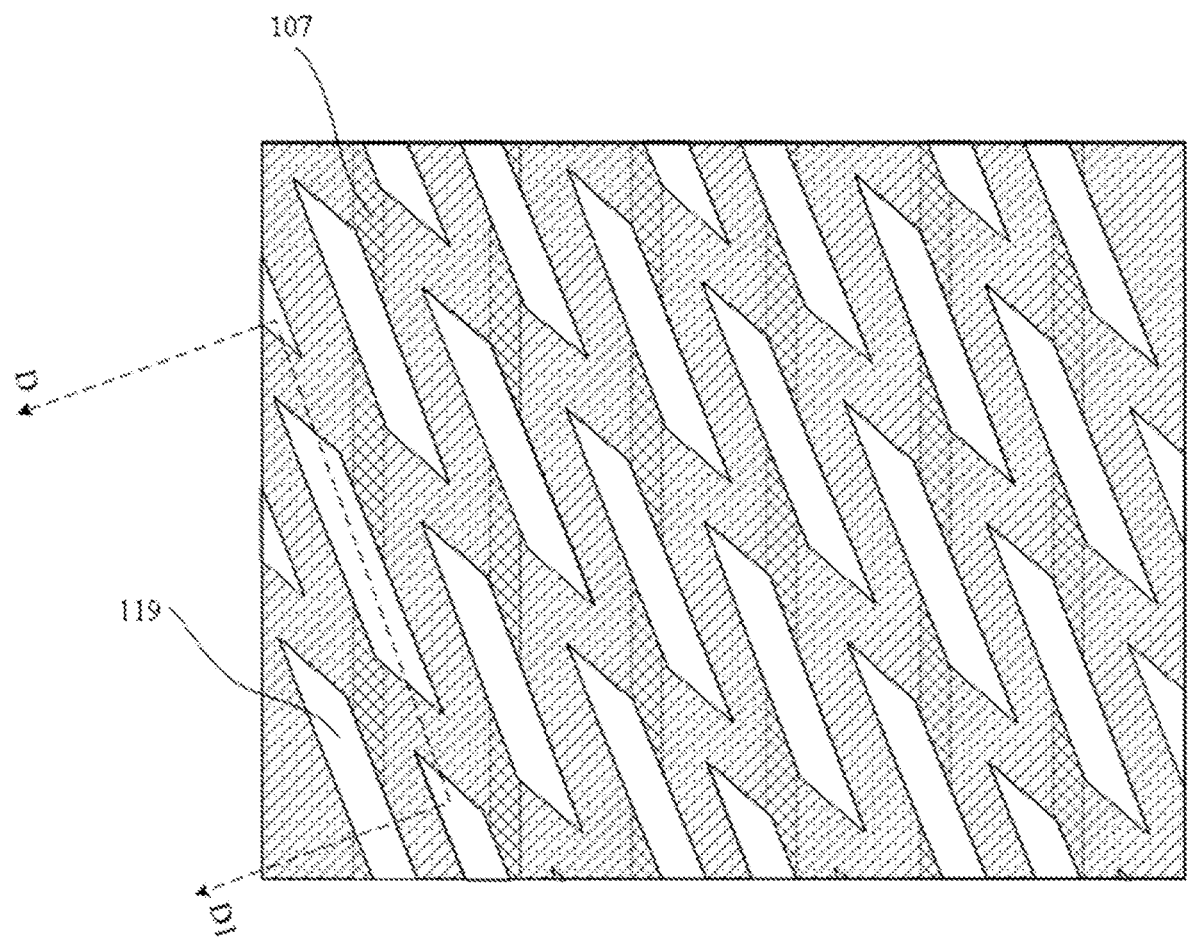
FIG. 17 is a schematic top structural diagram in which the sacrificial layer is provided with a second mask layer according to the embodiment of the present application.
Figure 18:
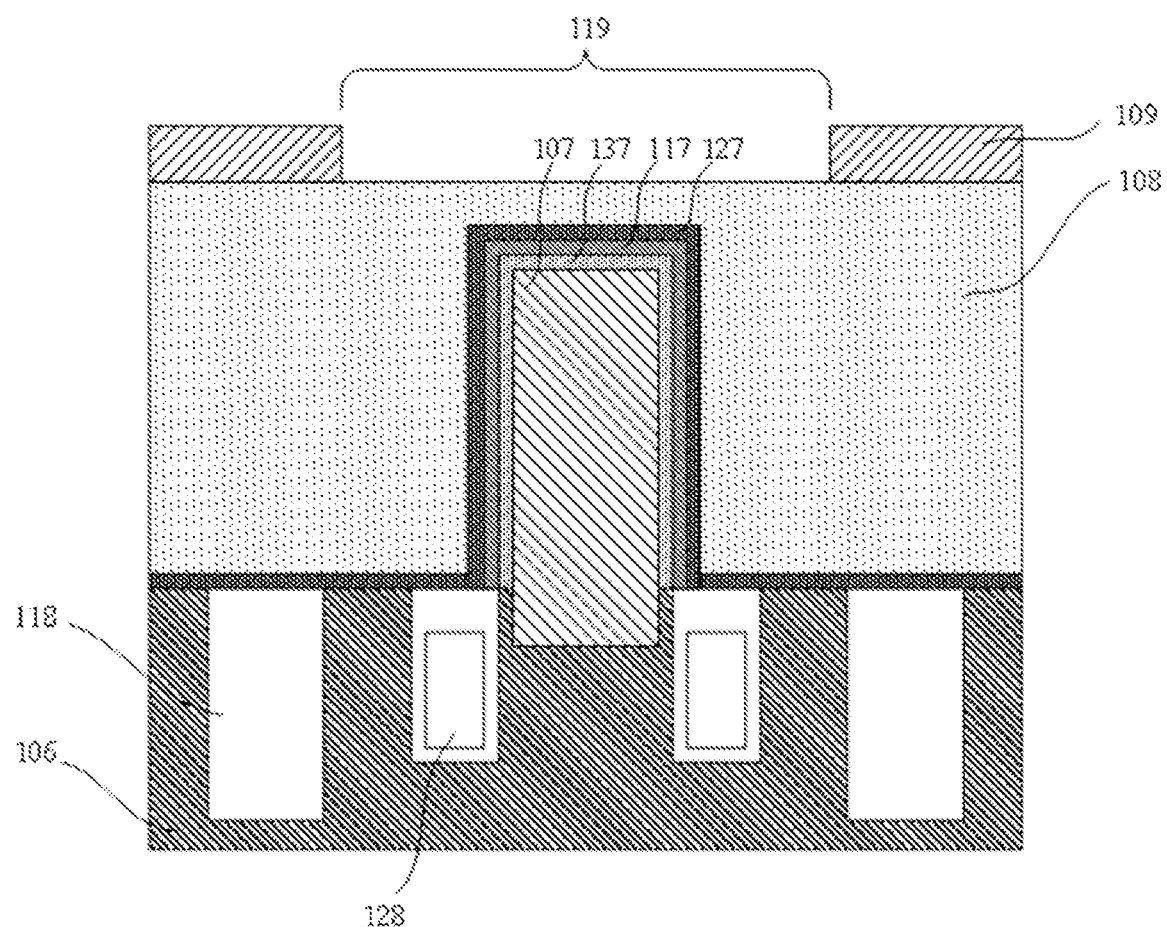
FIG. 18 is a schematic partial sectional structural diagram of FIG. 17 taken along direction DD1 according to the embodiment of the present application.
Figure 19:
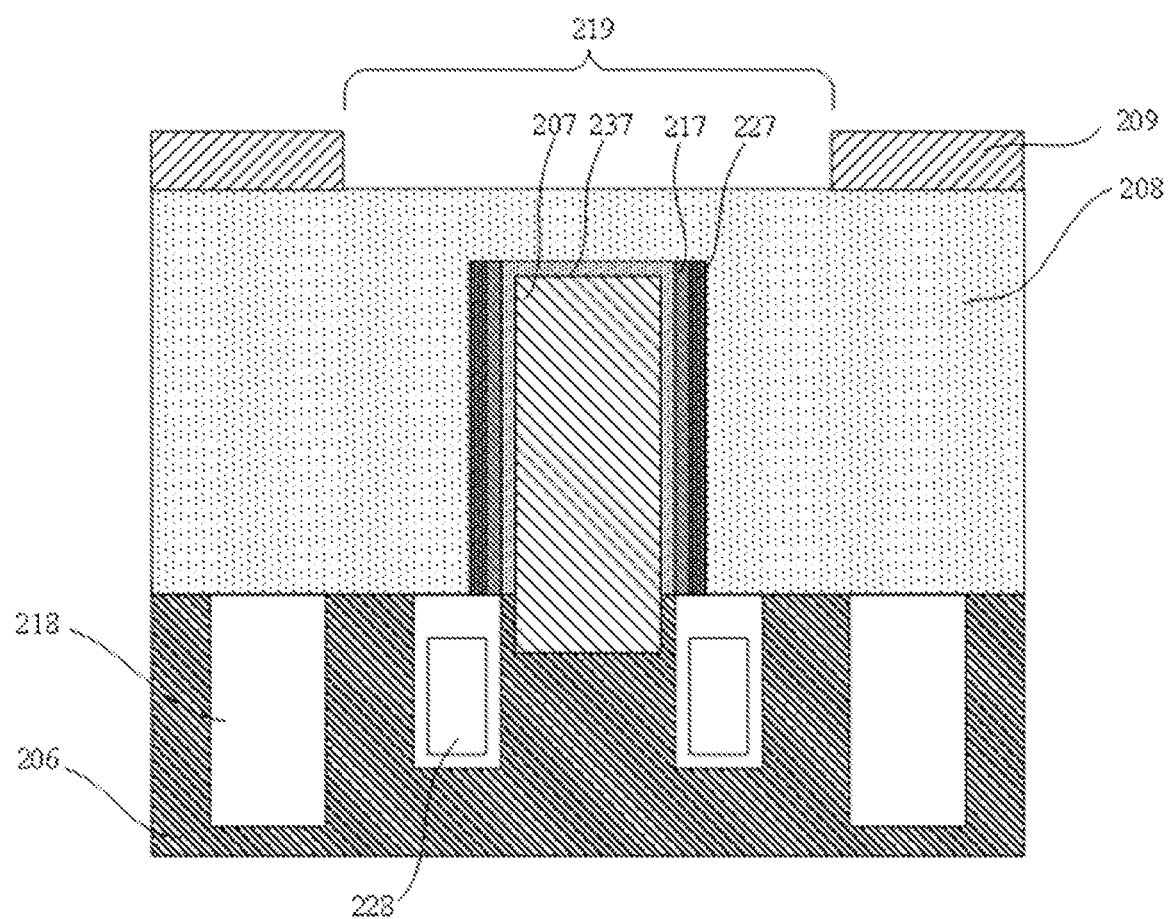
FIG. 19 is a schematic partial sectional structural diagram of FIG. 17 taken along direction DD1 according to another embodiment of the present application.

Referring to FIGS. 17 to 19, FIG. 17 is a schematic top structural diagram in which the sacrificial layer is provided with the second mask layer, FIG. 18 is a schematic partial sectional structural diagram of FIG. 17 taken along direction DD1 according to the present embodiment, and FIG. 19 is a schematic partial sectional structural diagram of FIG. 17 taken along direction DD1 according to another embodiment.

In the present embodiment, the second mask layer 109 with the second mask pattern 119 is formed on the sacrificial layer 108, and the first mask pattern 111 (referring to FIG. 3) is complementary to the second mask pattern 119.

For example, the first mask pattern 111 and the second mask pattern 119 have substantially the same size and shape as well as opposite properties; for example, the first mask pattern 111 is a mask reserved after the first mask layer 101 is etched, and the second mask pattern 119 is an opening formed by etching the second mask layer 109.

The second mask pattern 119 is configured to define a pattern and a position of the subsequently-formed contact hole structure. For example, in the present embodiment, the second mask pattern 119 includes a plurality of elongated openings arranged in an array. In the subsequent process step of forming the contact hole structure, the sacrificial layer 108 under the elongated opening is etched, while the sacrificial layer 108 under a region between the adjacent elongated openings is not etched, thereby forming the plurality of contact hole structures corresponding to the active regions. In some embodiments, in the subsequent process step of forming the contact hole structure, the first spacer layer 117 is also etched, such that the gap is formed between the second spacer layer 127 and the bitline 107.

The elongated pattern (referring to FIG. 3) has the consistent size and shape with the elongated opening, and the elongated pattern and the elongated opening have superposed projections on the base 100 (referring to FIG. 1). In the present embodiment, the projections of the elongated pattern and the elongated opening on the base 100 (referring to FIG. 1) are orthographic projections.

In the present embodiment, the second mask pattern is also formed using the first photomask and the second photomask. Steps of forming the second mask pattern will be described in detail below with reference to the accompanying drawings.

FIGS. 20 to 26 are schematic structural diagrams corresponding to the steps of forming the second mask pattern using the first photomask and the second photomask according to the present embodiment.

Figure 20:
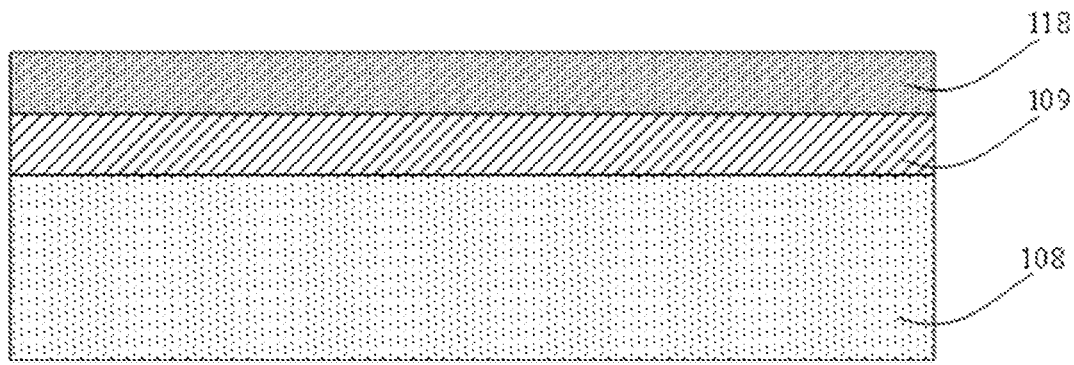
FIGS. 20 to 26 are schematic top structural diagrams corresponding to steps of forming a second mask pattern using the first photomask and the second photomask according to the embodiment of the present application.

Referring to FIG. 20, an unpatterned second mask layer 109 is formed on the sacrificial layer 108.

For example, the second mask layer 109 is located on the sacrificial layer 108 to provide a technological foundation for subsequent formation of a patterned second mask layer. In some embodiment, the second mask layer 109 may be made of a hard mask material, such as silicon oxide, silicon nitride, titanium nitride, or the like.

To form the second mask layer 109 with the second mask pattern 119, in the present embodiment, a third mask layer 118 is further formed on the second mask layer 109, and made of a different material from the second mask layer 109.

Figure 21:
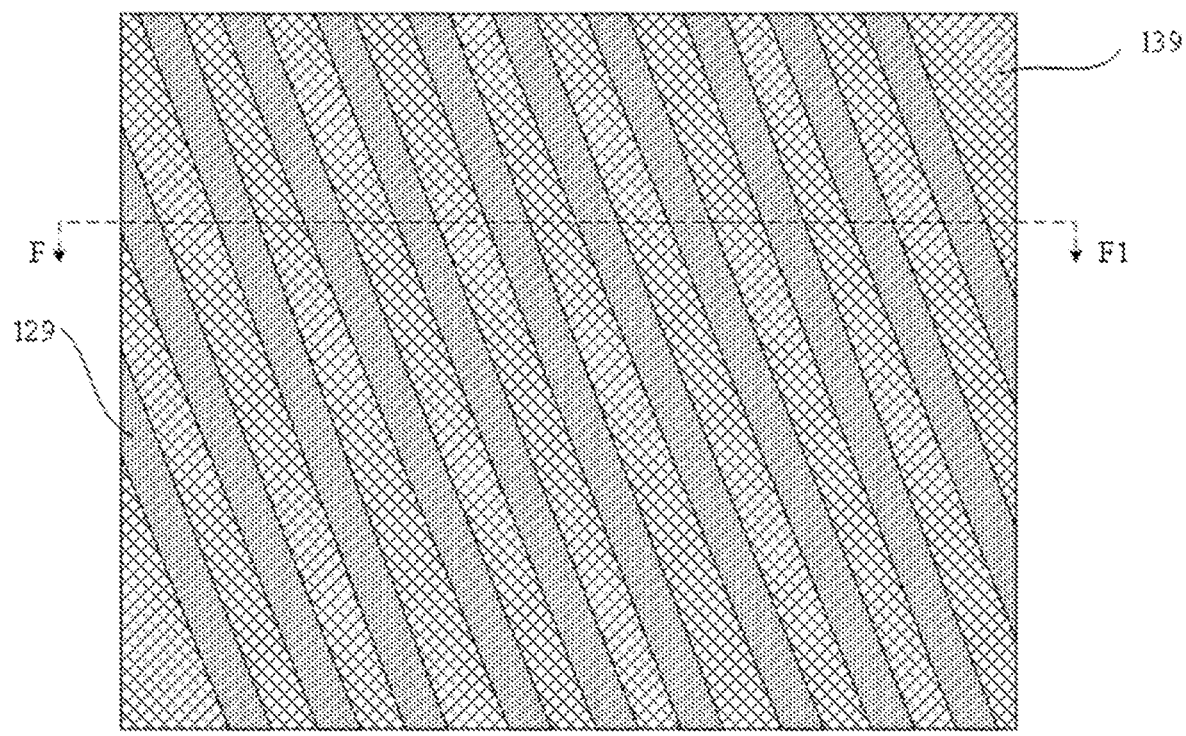
Figure 22:
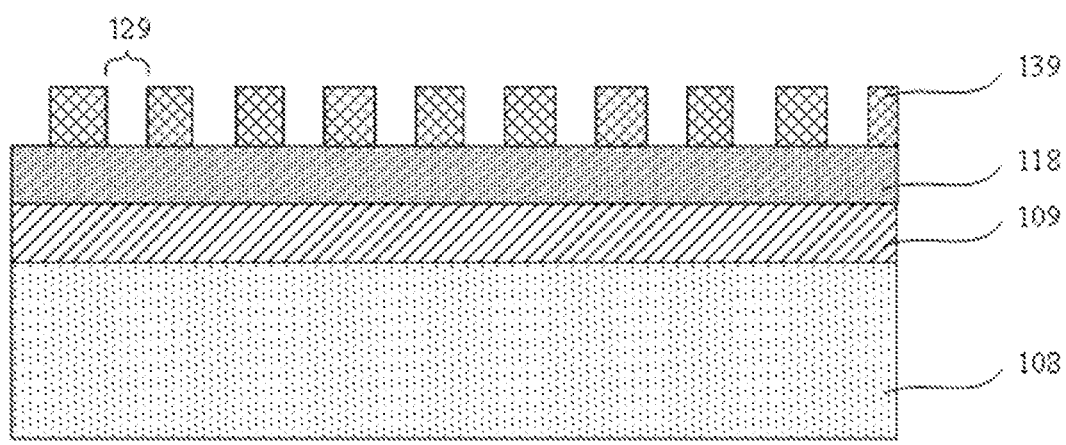

Referring to FIGS. 21 and 22, FIG. 21 is a schematic top structural diagram of a fourth mask layer with a first photoresist opening, and FIG. 22 is a schematic sectional structural diagram taken along direction FF1 in FIG. 21; the first photomask 2 (referring to FIG. 5) is provided, and the first photoresist opening 129 extending in the first direction is formed on the third mask layer 118 using the first photomask 2.

The first photomask 2 includes the first light-shielding region 21 and the first light-transmitting region 22. In the present embodiment, photoresist for forming the first photoresist line 103 (referring to FIG. 6) and photoresist for forming the first photoresist opening 129 have different properties, such that the first photoresist opening 129 and the first photoresist line 103 have same positions parallel to a surface of the base.

For example, the first photoresist opening 129 is located in photoresist 139. In the present embodiment, the foregoing first photoresist line is made of positive photoresist, and correspondingly, the photoresist 139 forming the first photoresist opening 129 is negative photoresist.

The step of forming the first photoresist opening 129 includes: forming the covering photoresist 139, the photoresist 139 having an exposure region and a non-exposure region; exposing the photoresist 139 using the first photomask 2, the first light-transmitting region 22 corresponding to the exposure region, the first light-shielding region 21 corresponding to the non-exposure region, and properties of a material in the exposure region of the photoresist 139 being changed in the exposure process; after the exposure, performing development to remove the photoresist 139 in the non-exposure region, i.e., the photoresist 139 corresponding to the first light-shielding region 21, thereby forming the first photoresist opening 129.

It should be noted that, in other embodiments, the photoresist forming the first photoresist line may be negative photoresist, and the photoresist forming the first photoresist opening may correspondingly be positive photoresist.

Figure 23:
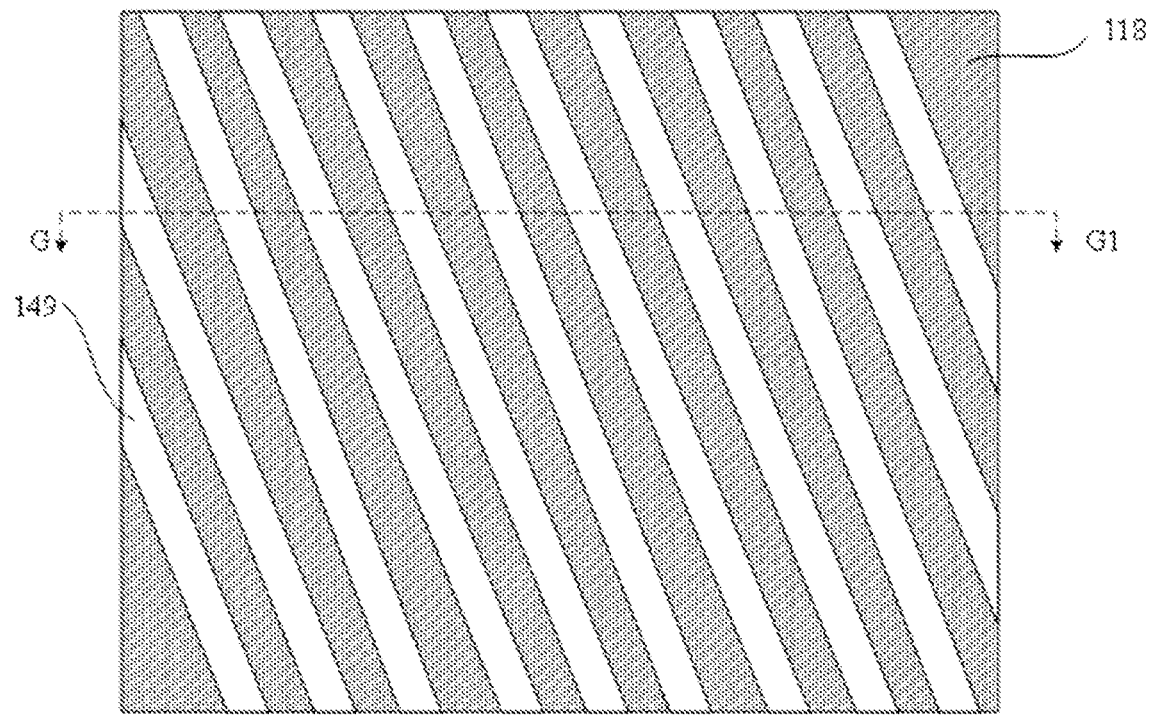
Figure 24:
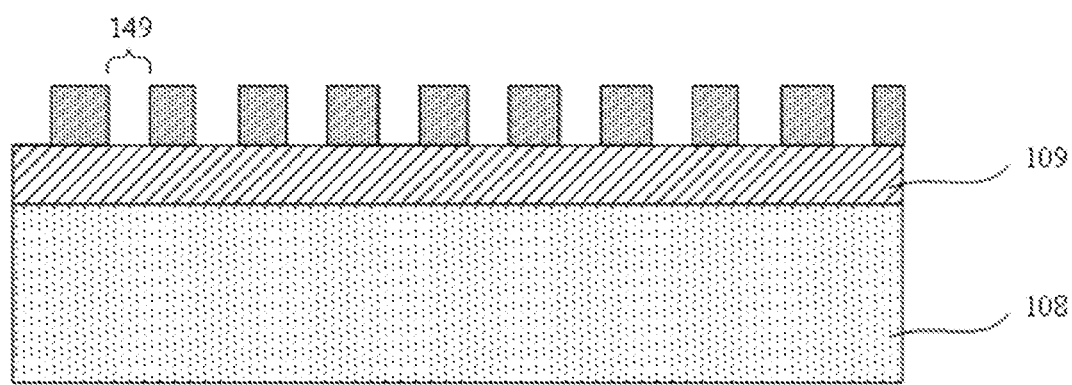

Referring to FIGS. 23 and 24, FIG. 23 is a schematic top structural diagram of the etched third mask layer, and FIG. 24 is a schematic sectional structural diagram of FIG. 23 taken along direction EE1; the third mask layer 118 is etched using the first photoresist opening 129 to form a first mask opening 149.

In the present embodiment, the process step of forming the first mask opening 149 includes: etching the third mask layer 118 with the photoresist 139 forming the first photoresist opening 129 as a mask, such that the third mask layer 118 has the first mask opening 149.

In the present embodiment, both the first mask opening 149 and the first photoresist line 103 (referring to FIG. 6) directly face the first light-shielding region 21, such that the first mask opening 149 and the first photoresist line 103 have the consistent sizes and shapes as well as superposed projections on the base 100 (referring to FIG. 1). In the present embodiment, the projections of the first mask opening 149 and the first photoresist line 103 on the base 100 (referring to FIG. 1) are orthographic projections.

Figure 25:
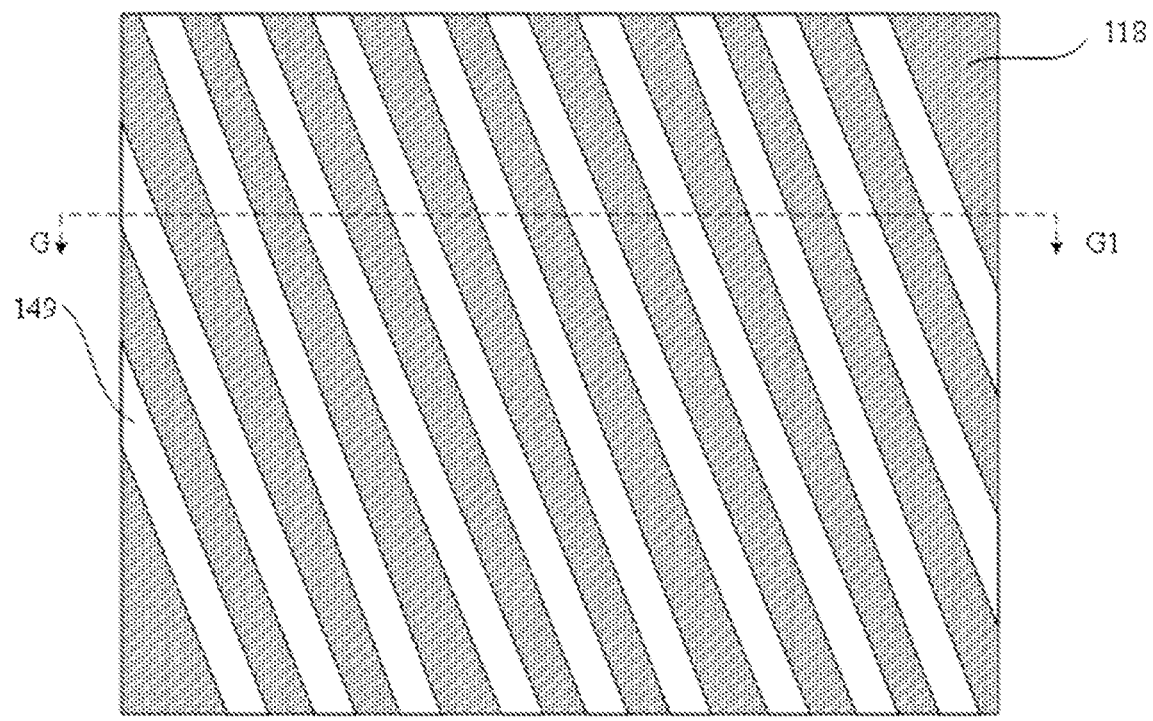
Figure 26:
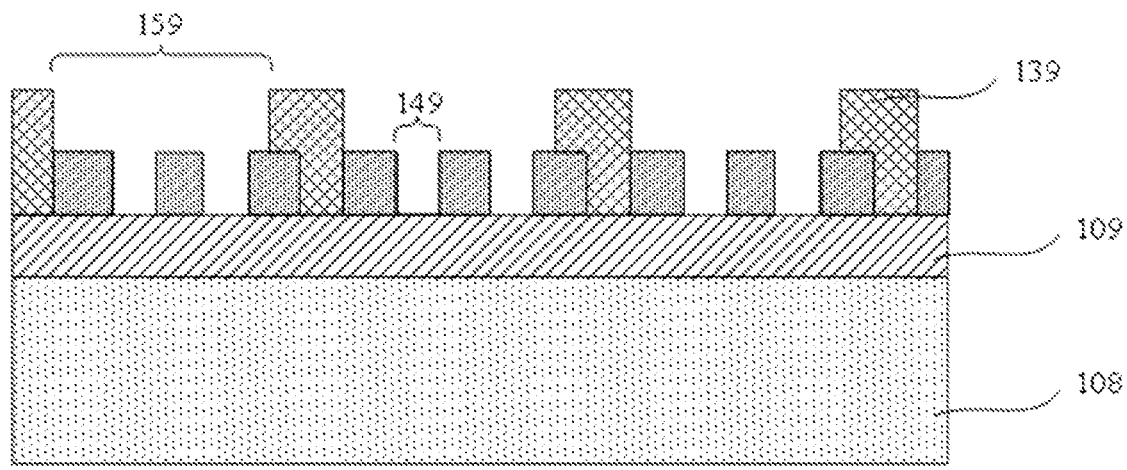

Referring to FIGS. 25 to 26, FIG. 25 is a schematic top structural diagram of the first mask opening with a second photoresist opening, and FIG. 26 is a schematic sectional structural diagram of FIG. 25 taken along direction GG1; the second photomask 3 is provided, and the second photoresist opening 159 extending in the second direction is formed on the first mask opening 149 using the second photomask 3.

The second photomask 3 includes the second light-shielding region 31 and the second light-transmitting region 32.

In the present embodiment, photoresist for forming the second photoresist line 104 (referring to FIG. 10) and photoresist for forming the second photoresist opening 159 also have different properties. For example, in the present embodiment, the photoresist forming the second photoresist line 104 is positive photoresist, and the photoresist forming the second photoresist opening 159 is negative photoresist.

The process step of forming the second photoresist opening includes: forming the covering photoresist 139, the photoresist 139 having an exposure region and a non-exposure region; exposing the photoresist 139 using the second photomask 3, the second light-transmitting region 32 corresponding to the exposure region, the second light-shielding region 31 corresponding to the non-exposure region, and properties of a material in the exposure region of the photoresist 139 being changed in the exposure process; after the exposure, performing development to remove the photoresist 139 in the non-exposure region, i.e., the photoresist 139 corresponding to the second light-shielding region 31, thereby forming the second photoresist opening 159.

It should be noted that, in other embodiments, the photoresist forming the second photoresist line may be negative photoresist, and the photoresist forming the second photoresist opening may correspondingly be positive photoresist.

In the present embodiment, the photoresist 139 in the exposure region is also located in a partial region of the first mask opening 149, such that the segmented elongated opening as shown in FIG. 17 may be formed when the second mask layer 109 is subsequently etched with the second photoresist opening 159 and the first mask opening 149 as masks.

In the present embodiment, both the second photoresist opening 159 and the second photoresist line 104 (referring to FIG. 10) directly face the second light-shielding region 31, such that the second photoresist opening 159 and the second photoresist line 104 have the consistent sizes and shapes as well as superposed projections on the base 100 (referring to FIG. 1). In the present embodiment, the projections of the second photoresist opening 159 and the second photoresist line 104 on the base 100 (referring to FIG. 1) are orthographic projections.

Referring to FIGS. 18 and 26, the second mask layer 109 is etched using the second photoresist opening 159 and the first mask opening 149 to form the elongated opening.

For example, when the second mask layer 109 is etched with a combined pattern of the second photoresist opening 159 and the first mask opening 149 as a mask, a position where the second photoresist opening 159 is overlapped with the first mask opening 149 exposes the second mask layer 109 under the position, and the second mask layer 109 at this position is etched away to form the elongated opening as shown in FIG. 17.

In the present embodiment, since the first mask opening 149 and the first photoresist line 103 have the consistent sizes and shapes as well as the superposed projections on the base 100 (referring to FIG. 1), and the second photoresist opening 159 and the second photoresist line 104 have the consistent sizes and shapes as well as the superposed projections on the base 100 (referring to FIG. 1), the subsequently-formed elongated pattern and elongated opening have the consistent sizes and shapes as well as superposed projections on the base 100 (referring to FIG. 1).

In the present embodiment, the side wall of the elongated pattern is provided with the repair layer 105 (referring to FIG. 11), and when the base 100 (referring to FIG. 1) is etched with the first mask layer 101 (referring to FIG. 2) having the repair layer 105 (referring to FIG. 11) as a mask to form the active region 106 (referring to FIG. 13), a pattern of the active region 106 (referring to FIG. 13) has a greater size than the elongated opening, but a projection of the active region 106 (referring to FIG. 13) on the base 100 (referring to FIG. 1) completely covers the projection of the elongated opening on the base 100 (referring to FIG. 1), so as to facilitate alignment between the subsequently-formed contact hole structure and the active region 106 (referring to FIG. 13).

Figure 27:
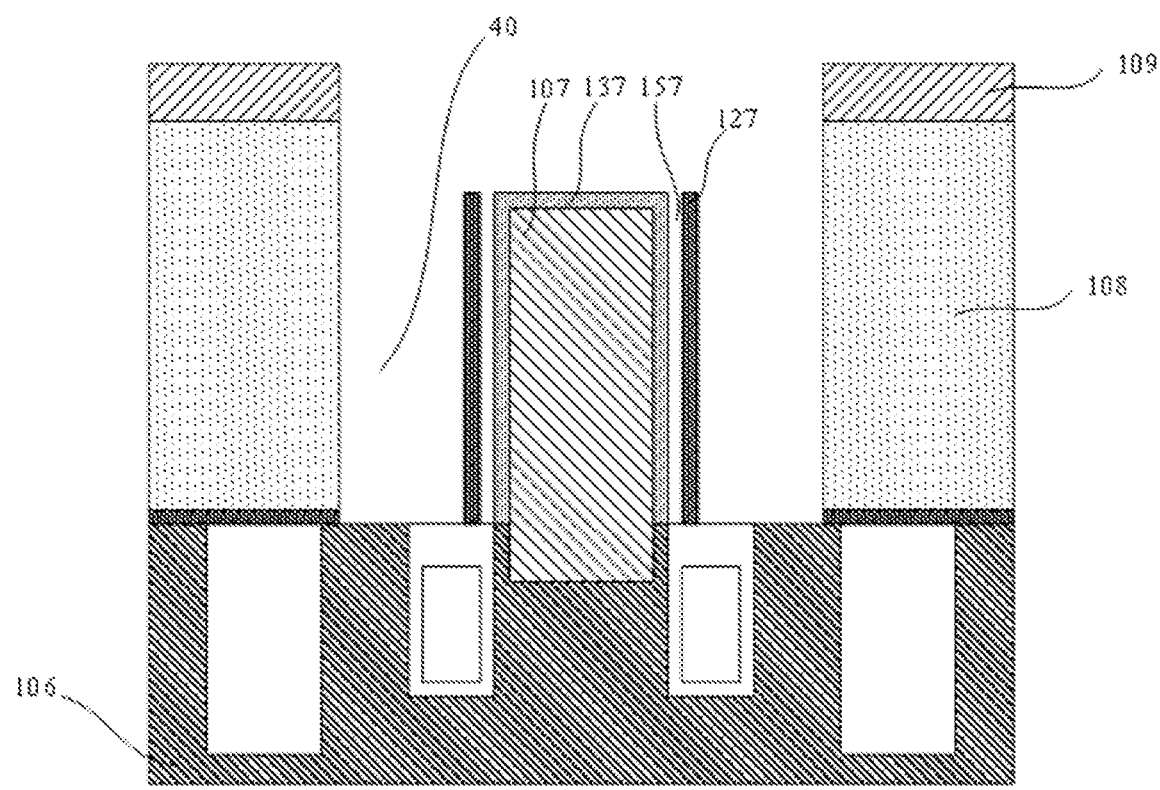
FIG. 27 is a schematic sectional structural diagram of formation of a contact hole structure and a gap according to the embodiment of the present application.

Referring to FIG. 27, FIG. 27 is a schematic sectional structural diagram of formation of the contact hole structure and the gap according to the present embodiment, the sacrificial layer 108 is etched with the second mask layer 109 as a mask to form the plurality of contact hole structures 40, and the first spacer layer 117 is etched to form the gap 157 between the second spacer layer 127 and the bitline 107.

In the present embodiment, after the sacrificial layer 108 is formed, in the process of etching the sacrificial layer 108 with the second mask layer 109 as the mask, the corresponding second spacer layer 127 under the elongated opening of the second mask layer 109 is removed, and the second spacer layer 127 is still present between the unremoved sacrificial layer 108 and the active region 106.

Figure 28:
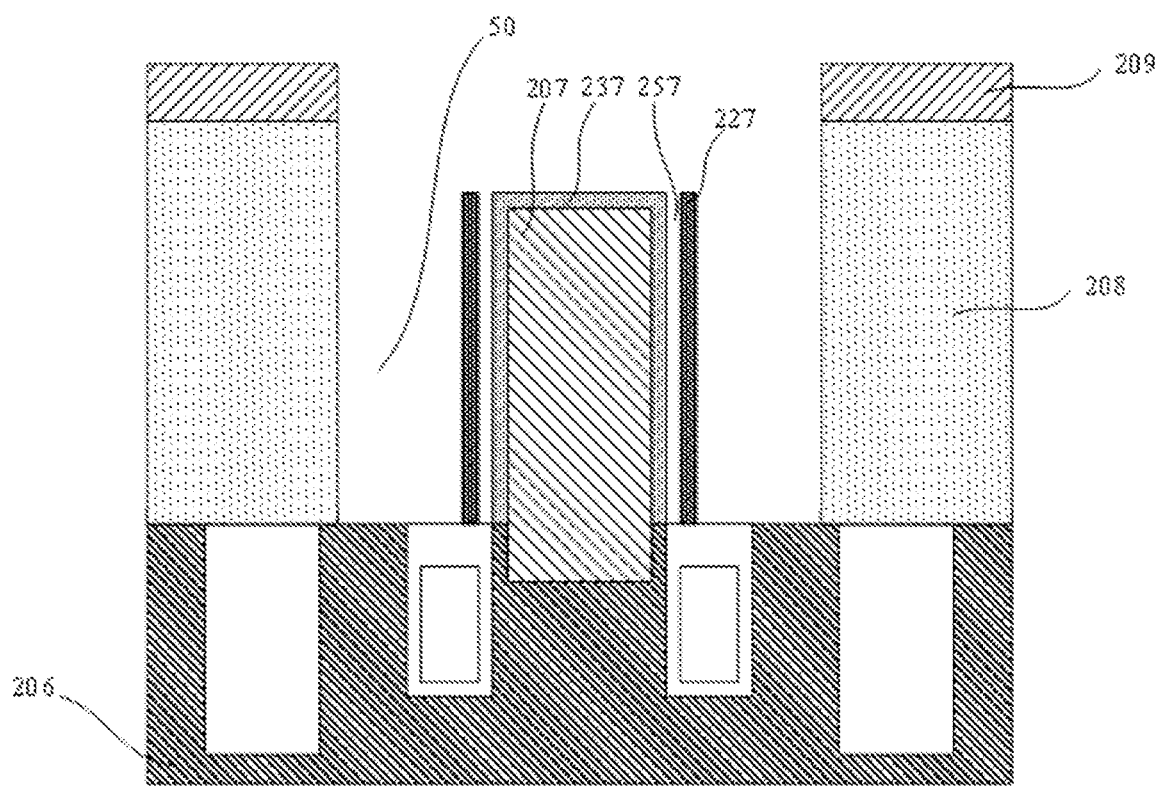
FIG. 28 is a schematic sectional structural diagram of formation of a contact hole structure and a gap according to another embodiment of the present application.

In other embodiments, referring to FIG. 28, FIG. 28 is a schematic sectional structural diagram of the formation of the contact hole structure and the gap according to another embodiment, before the sacrificial layer 208 is etched with the second mask layer 209 as a mask, the second spacer layer 227 on the surface of the active region 206 is removed, and then, the subsequently-unremoved sacrificial layer 208 directly contacts the active region 206.

In the present embodiment, the third spacer layer 137 is also formed on the side wall of the bitline 107, and the gap 157 is located between the second spacer layer 127 and the third spacer layer 137. After the contact structure is subsequently-formed in the contact hole structure 40, the gap 157 may improve an effect of isolation between the contact structure and the bitline 107, and since the gap 157 has a small dielectric constant, the dielectric constant between the contact structure and the bitline may be reduced, thereby reducing the parasitic capacitance between the contact structure and the bitline, and improving the electrical properties of the semiconductor structure.

In the present embodiment, both the sacrificial layer 108 and the first spacer layer 117 are etched using a dry etching method, and the sacrificial layer 108 and the first spacer layer 117 located under the elongated opening are all etched away to form the contact hole structure 40 and the gap 157.

Figure 29:
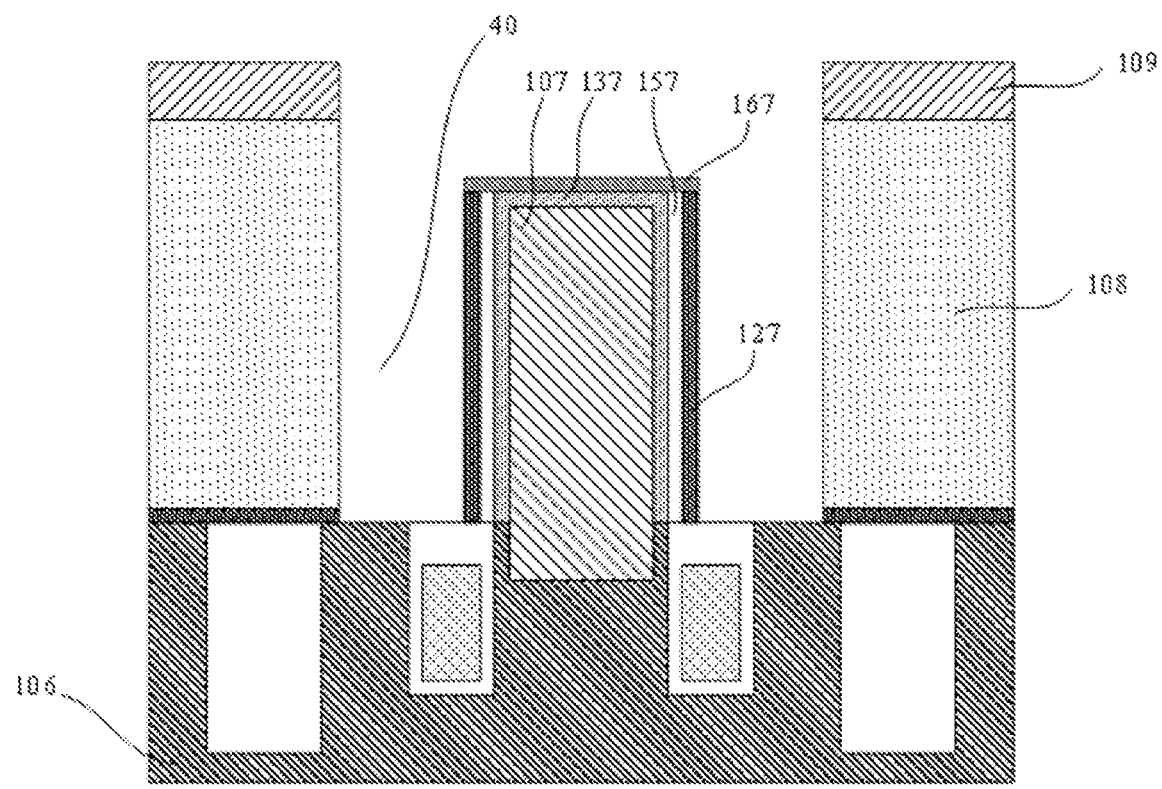
FIG. 29 is a schematic sectional structural diagram in which a cover layer is formed on the gap according to the embodiment of the present application.
Figure 30:
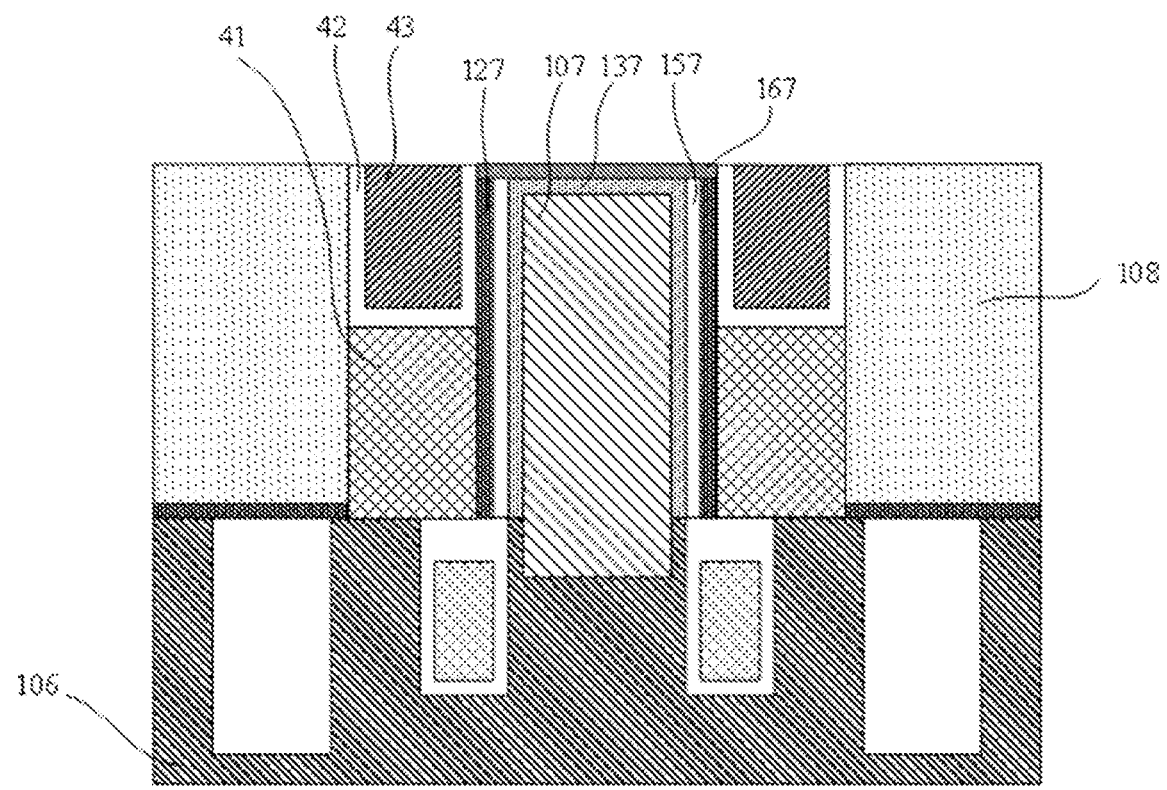
FIG. 30 is a schematic sectional structural diagram of formation of a contact structure on the basis of FIG. 29.
Figure 31:
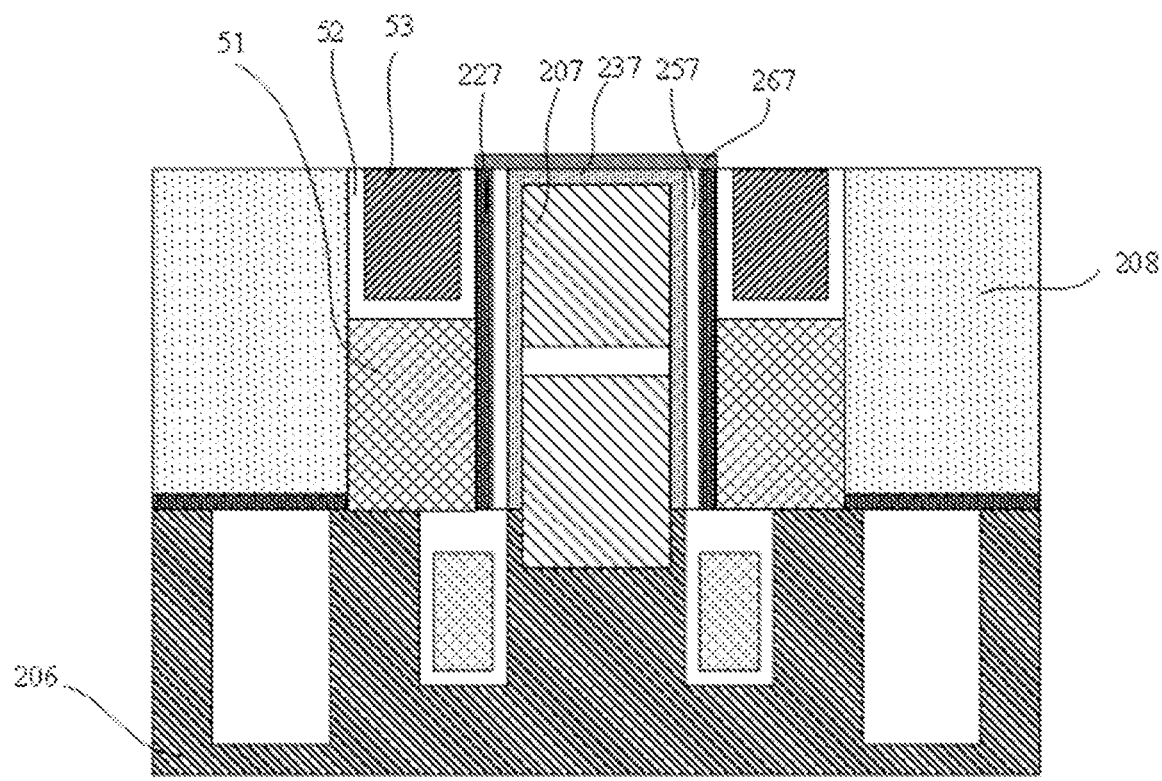
FIG. 31 is a schematic sectional structural diagram in which a cover layer is formed on the gap according to another embodiment of the present application.

Referring to FIGS. 29 to 31, FIG. 29 is a schematic sectional structural diagram of an example in which the cover layer is formed on the gap, FIG. 30 is a schematic sectional structural diagram of formation of the contact structure on the basis of FIG. 29, and FIG. 31 is a schematic sectional structural diagram of another example in which the cover layer is formed on the gap.

In the present embodiment, referring to FIG. 29, the cover layer 167 is formed and seals the gap 157.

For example, the process step of forming the cover layer 167 includes: forming the cover layer 167 covering the top of the bitline 107 and a top of the second spacer layer 127, the cover layer 167 being also located at a bottom of the contact hole structure 40; before the contact hole structure 40 is filled with a conductive material, removing the cover layer 167 located at the bottom of the contact hole structure 40.

Referring to FIG. 30, after removal of the cover layer 167 located at the bottom of the contact hole structure 40, the contact hole structure 40 is filled up with an initial first conductive layer, and a top of the initial first conductive layer is flush with the top of the sacrificial layer 108; the sacrificial layer 108 and the initial first conductive layer are ground mechanically, such that the tops of the sacrificial layer 108 and the initial first conductive layer are flush with the top of the cover layer 167; the initial first conductive layer is etched to form a first conductive layer 41; a diffusion barrier layer 42 and a second conductive layer 43 are sequentially formed on the first conductive layer 41 to form the contact structure.

In the present embodiment, a material of the first conductive layer 41 includes polycrystalline silicon, a material of the diffusion barrier layer 42 includes titanium nitride, and a material of the second conductive layer 43 includes tungsten.

In other embodiments, referring to FIG. 31, before formation of the cover layer 267, the method further includes: filling the contact hole structure with a conductive material to form the contact structure, the contact structure being located on the tops of the bitline 207 and the second spacer layer 227; after removal of the contact structure above the top of the second spacer layer 227, forming the cover layer on the tops of the bitline 207 and the second spacer layer 227.

For example, before formation of the cover layer 267, the contact hole structure is first filled with the first conductive layer 51, and the top of the first conductive layer 51 is lower than the top of the bitline 207; the diffusion barrier layer 52 is formed on the first conductive layer 51, the diffusion barrier layer 52 is also located on tops of the second spacer layer 227 and the gap 257, and then, the diffusion barrier layer 52 seals the gap 257; a surface of the diffusion barrier layer 52 is covered with one second conductive layer 53, and a top of the second conductive layer 53 is flush with the top of the sacrificial layer 208; the sacrificial layer 208, the second conductive layer 53 and the diffusion barrier layer 52 are ground mechanically, such that the tops of the sacrificial layer 208, the second conductive layer 53 and the diffusion barrier layer 52 are all flush with the second spacer layer 227; finally, the cover layer 267 is formed on the tops of the second spacer layer 227, the gap 257, and the third spacer layer 237.

In the present embodiment, the first mask layer 101 having the first mask pattern 111 is manufactured using the first photomask 2 and the second photomask 3, and the active region 106 of the semiconductor structure is manufactured using the first mask layer 101; and the second mask layer 109 having the second mask pattern 119 is manufactured using the first photomask 2 and the second photomask 3 again, and the contact hole structure 40 of the semiconductor structure is manufactured using the second mask layer 109, thereby reducing the number of the photomask required for manufacturing the active region 106 and the contact hole structure 40 in the semiconductor structure, so as to reduce the manufacturing cost of the semiconductor structure.

The first mask pattern 111 is complementary to the second mask pattern 119; that is, the subsequently-formed elongated pattern and elongated opening have the consistent sizes and shapes as well as the superposed projections on the base 100 (referring to FIG. 1), such that the alignment of the subsequently-formed active region 106 and contact hole structure 40 is facilitated, and one elongated opening in the second mask layer 109 may correspondingly form two contact hole structures 40 on the two sides of the same bitline 107.

In other embodiments, the second mask pattern 119 has a greater size than the first mask pattern 111, such that the projection of the second mask pattern 119 on the base 100 completely covers the projection of the first mask pattern 111 on the base 100, a size of an opening of the subsequently-formed contact hole structure 40 is increased, and a process window for forming the contact structure is increased while a contact area between the contact structure and the active region 106 is increased. For example, the size of the second mask pattern 119 may be adjusted by fine tuning conditions of a photolithography process or an etching process (for example, increasing exposure energy, prolonging an etching time, or the like), such that the size of the second mask pattern 119 is slightly greater than that of the first mask pattern 111.

In other embodiments, an included angle less than 30 degrees is formed between an extending direction of the second mask pattern 119 and an extending direction of the first mask pattern 111. By adjusting rotation angles of the first photomask and the second photomask during the exposure, the included angle between the extending directions of the formed second mask pattern 119 and first mask pattern 111 may be adjusted, such that the position of the subsequently-formed contact hole structure 40 falling on the active region 106 is adjustable, thus further improving a flexibility of the process.

In other embodiments, the first mask pattern 111 and the second mask pattern 119 may also be formed using a self-aligned double patterning (SADP) process and a reverse-SADP process. For example, the first mask pattern 111 is formed by overlapping and etching a first part of the first mask pattern formed using the reverse-SADP process and a second part of the first mask pattern formed using the reverse-SADP process; the second mask pattern 119 is formed by overlapping and etching a first part of the second mask pattern formed using the SADP process and a second part of the second mask pattern formed using the SADP process; the first parts of the first and second mask patterns are formed using the same photomask, and the second parts of the first and second mask patterns are formed using the same photomask.

In the present embodiment, since the first spacer layer 117 is made of a different material from the second spacer layer 127 and the third spacer layer 137, and the sacrificial layer 108 is made of the same material as the first spacer layer 117, the sacrificial layer 108 and the first spacer layer 117 under the elongated opening may be etched selectively, and the second spacer layer 127 is reserved, such that the gap 157 is formed while the contact hole structure 40 is formed, and thus, one elongated opening may correspondingly form two contact hole structures 40 and two gaps 157 on the two sides of the same bitline 107.

After the contact structure is formed in the contact hole structure 40, the gap 157 may improve the effect of isolation between the contact structure and the bitline 107, and since the gap 157 has a small dielectric constant, the dielectric constant between the contact structure and the bitline may be reduced, thereby reducing the parasitic capacitance between the contact structure and the bitline, and improving the electrical properties of the semiconductor structure.

The ordinary skills in the art can understand that the implementations described above are particular embodiments for implementing the present application. In practical uses, various changes in forms and details may be made to the implementations without departing from the spirit and scope of the present application. Any skills in the art may make their own changes and modifications without departing from the spirit and scope of the present application. Therefore, the protection scope of the present application shall be subject to the protection scope of the claims.

What is claimed is:

1. A manufacturing method of a semiconductor structure, comprising:
   providing a base;
   forming a first mask layer with a first mask pattern on the base, and etching the base with the first mask layer as a mask to form an active region;
   forming a plurality of discrete bitlines on the active region;
   sequentially stacking a first spacer layer and a second spacer layer on a side wall of the bitline;
   forming a sacrificial layer between the adjacent second spacer layers;
   forming a second mask layer with a second mask pattern on the sacrificial layer, the first mask pattern being complementary to the second mask pattern;
   etching the sacrificial layer with the second mask layer as a mask to form a plurality of contact hole structures; and
   etching the first spacer layer to form a gap between the second spacer layer and the bitline.

2. The manufacturing method of a semiconductor structure according to claim 1, wherein the second spacer layer is also formed at a top of the bitline, and before etching the first spacer layer, the manufacturing method further comprises: etching away the second spacer layer above the top of the bitline to expose the first spacer layer.

3. The manufacturing method of a semiconductor structure according to claim 1, further comprising: forming a third spacer layer between the side wall of the bitline and the first spacer layer, the third spacer layer being made of a different material from the first spacer layer, and the first spacer layer being made of a different material from the second spacer layer.

4. The manufacturing method of a semiconductor structure according to claim 3, wherein the first spacer layer and the third spacer layer are also formed at a top of the bitline, and before forming the sacrificial layer, the manufacturing method further comprises: removing the second spacer layer at the top of the bitline to expose the first spacer layer.

5. The manufacturing method of a semiconductor structure according to claim 3, wherein the first spacer layer and the third spacer layer are also formed at a top of the bitline, and after forming the sacrificial layer, the manufacturing method further comprises: removing the second spacer layer at the top of the bitline to expose the first spacer layer.

6. The manufacturing method of a semiconductor structure according to claim 1, further comprising: forming a cover layer, the cover layer sealing the gap.

7. The manufacturing method of a semiconductor structure according to claim 6, wherein the process step of forming the cover layer comprises: forming the cover layer covering a top of the bitline and a top of the second spacer layer, the cover layer being also located at a bottom of the contact hole structure; before the contact hole structure is filled with a conductive material, removing the cover layer located at the bottom of the contact hole structure.

8. The manufacturing method of a semiconductor structure according to claim 6, before forming the cover layer, further comprising: filling the contact hole structure with a conductive material to form a contact structure, the contact structure being located on tops of the bitline and the second spacer layer; after removing the contact structure above a top of the second spacer layer, forming the cover layer on the tops of the bitline and the second spacer layer.

9. The manufacturing method of a semiconductor structure according to claim 1, wherein the first mask pattern and the second mask pattern are formed using a same photomask.

10. The manufacturing method of a semiconductor structure according to claim 9, wherein the first mask pattern comprises an elongated pattern, and the second mask pattern comprises an elongated opening.

11. The manufacturing method of a semiconductor structure according to claim 10, wherein the elongated pattern and the elongated opening have consistent sizes and shapes as well as superposed projections on the base.

12. The manufacturing method of a semiconductor structure according to claim 10, further comprising: forming a repair layer on a side wall of the elongated pattern.

13. The manufacturing method of a semiconductor structure according to claim 9, wherein the first mask pattern is formed using a first photomask and a second photomask; and the second mask pattern is formed using the first photomask and the second photomask.

14. The manufacturing method of a semiconductor structure according to claim 13, wherein the forming the first mask pattern using a first photomask and a second photomask comprises:
    forming an unpatterned first mask layer on the base;
    forming a first photoresist line extending in a first direction on the first mask layer using the first photomask;
    etching the first mask layer using the first photoresist line to form a first mask line;
    forming a second photoresist line extending in a second direction on the first mask line using the second photomask; and
    etching the first mask line using the second photoresist line to form an elongated pattern.

15. The manufacturing method of a semiconductor structure according to claim 14, wherein the forming the second mask pattern using the first photomask and the second photomask comprises:
    forming an unpatterned second mask layer on the sacrificial layer;
    forming a third mask layer on the second mask layer;
    forming a first photoresist opening extending in the first direction on the third mask layer using the first photomask;
    etching the third mask layer using the first photoresist opening to form a first mask opening;
    forming a second photoresist opening extending in the second direction on the first mask opening using the second photomask; and
    etching the second mask layer using the second photoresist opening and the first mask opening to form an elongated opening.

16. The manufacturing method of a semiconductor structure according to claim 15, wherein photoresist for forming the first photoresist line and photoresist for forming the first photoresist opening have different properties; and photoresist for forming the second photoresist line and photoresist for forming the second photoresist opening have different properties.

17. The manufacturing method of a semiconductor structure according to claim 1, wherein a projection of the second mask pattern on the base completely covers a projection of the first mask pattern on the base.

18. The manufacturing method of a semiconductor structure according to claim 1, wherein an included angle less than 30 degrees is formed between an extending direction of the second mask pattern and an extending direction of the first mask pattern.

19. The manufacturing method of a semiconductor structure according to claim 1, wherein a method for forming the first mask pattern and the second mask pattern comprises one or a combination of a self-aligned double patterning process and a reverse self-aligned double patterning process.

* * * * *